United States Patent
Huang et al.

(10) Patent No.: US 12,374,617 B2
(45) Date of Patent: Jul. 29, 2025

(54) METAL-INSULATOR-METAL CAPACITOR INCLUDING A DIELECTRIC PAD LAYER AND PROVIDING A HIGH CAPACITANCE A LOW LEAKAGE CURRENT

(71) Applicant: Taiwan Semiconductor Manufacturing Company, Ltd., Hsinchu (TW)

(72) Inventors: Yuan-Sheng Huang, Taichung (TW); Kaochao Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 537 days.

(21) Appl. No.: 17/658,732

(22) Filed: Apr. 11, 2022

(65) Prior Publication Data

US 2023/0326958 A1    Oct. 12, 2023

(51) Int. Cl.
*H01L 23/528*    (2006.01)

(52) U.S. Cl.
CPC .................. *H01L 23/528* (2013.01)

(58) Field of Classification Search
CPC ... H01L 23/528; H01L 23/5223; H01L 28/91; H01L 28/92; H10D 1/042; H10D 1/716
See application file for complete search history.

(56) References Cited

U.S. PATENT DOCUMENTS

| | | | |
|---|---|---|---|
| 2010/0224960 A1* | 9/2010 | Fischer | H01L 28/86 257/532 |
| 2017/0309563 A1* | 10/2017 | Zang | H01L 28/60 |
| 2018/0115730 A1 | 4/2018 | Velichko | |
| 2019/0013269 A1* | 1/2019 | Zhang | H01L 21/76831 |
| 2020/0105862 A1* | 4/2020 | Wu | H01L 23/53214 |
| 2023/0128595 A1* | 4/2023 | Cieslinski | H04N 25/78 348/230.1 |

* cited by examiner

*Primary Examiner* — Changhyun Yi
(74) *Attorney, Agent, or Firm* — Harrity & Harrity, LLP

(57) ABSTRACT

Some implementations described herein provide techniques and apparatuses for forming a semiconductor device including a metal-insulator-metal capacitor. The metal-insulator-metal capacitor includes a dielectric pad layer having a portion between a capacitor bottom metal electrode layer and a portion of an insulator layer. The dielectric pad layer may preserve a thickness of the insulator layer to reduce a likelihood of a leakage between a capacitor top metal electrode layer and the capacitor bottom metal electrode layer. The dielectric pad layer may also enable a reduction in a thickness of the insulator layer to increase a capacitance of the metal-insulator-metal capacitor.

20 Claims, 29 Drawing Sheets

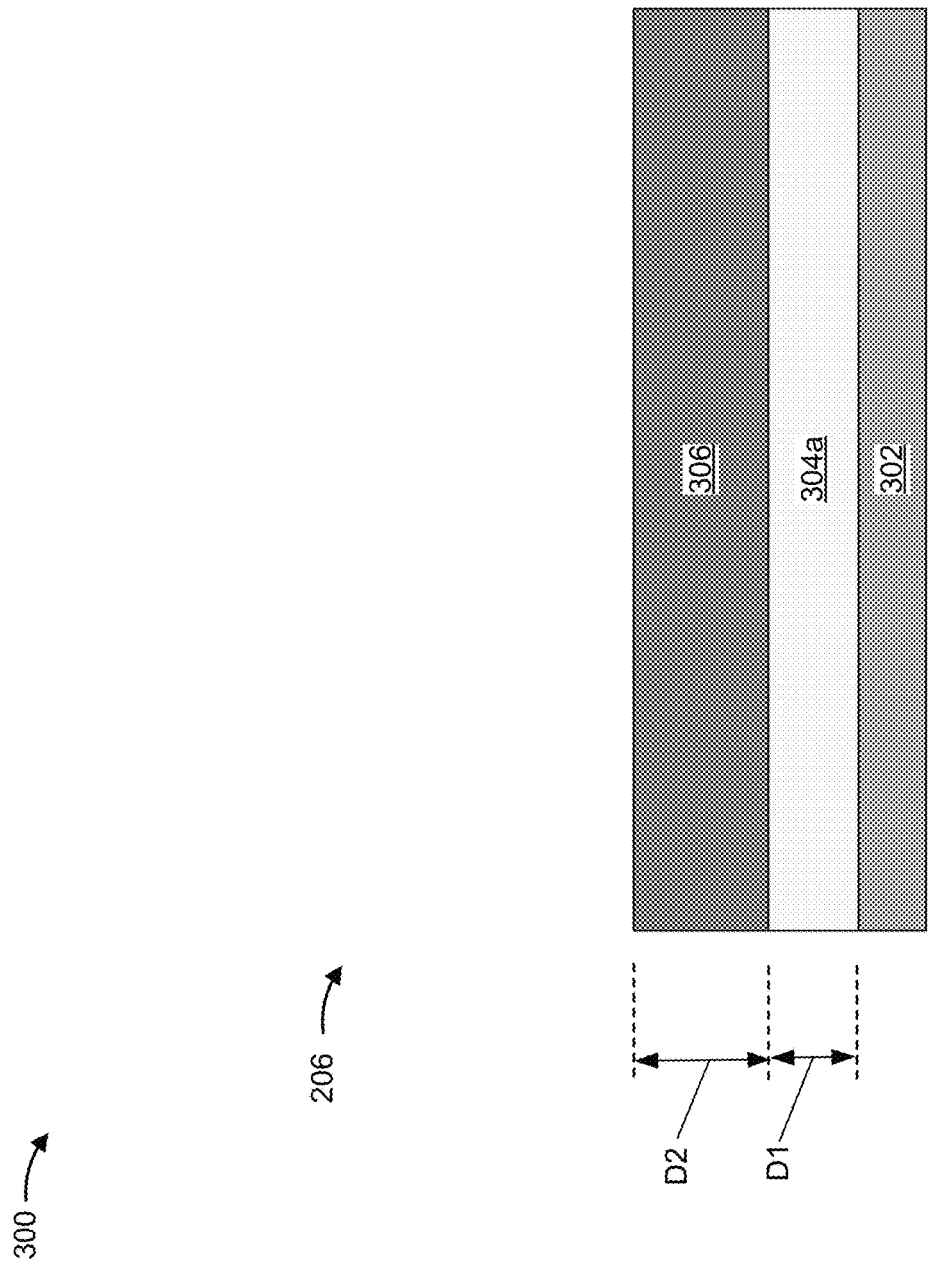

METAL-INSULATOR-METAL CAPACITOR INCLUDING A DIELECTRIC PAD LAYER AND PROVIDING A HIGH CAPACITANCE A LOW LEAKAGE CURRENT

BACKGROUND

A metal-insulator-metal (MIM) device can be used as a capacitor in a semiconductor device. A MIM device includes two metal layers, with an insulator layer between the two metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 3C, 3D, 3E, 3F, 3G, 3H, 3I, and 3J are diagrams of example implementations described herein.

DETAILED DESCRIPTION

Figure 1:
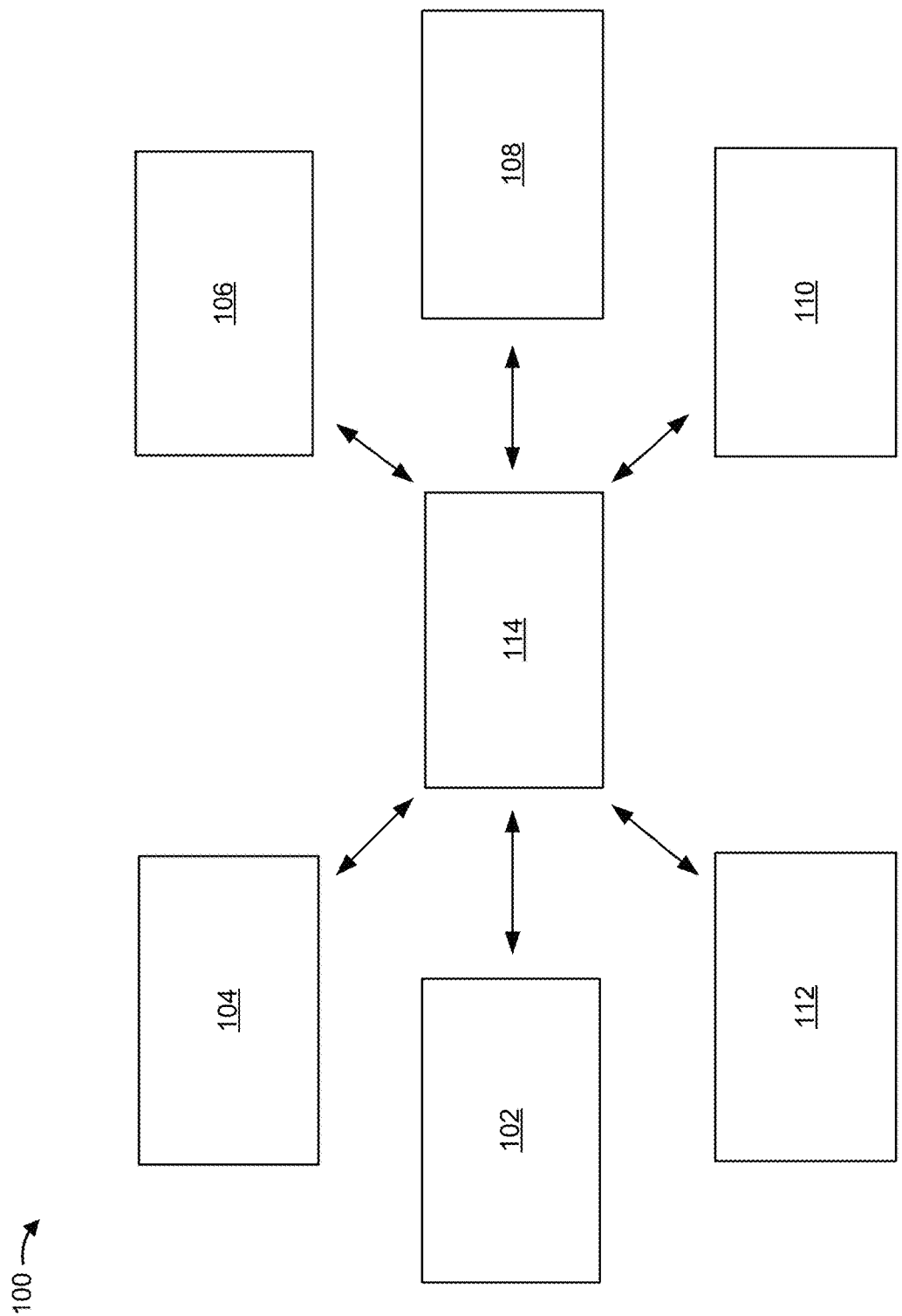
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-insulator-metal (MIM) device can be used as a capacitor in a semiconductor device. A MIM may include two metal layers, with an insulator layer between the two metal layers. Performance requirements of the MIM device in the semiconductor device may include a high capacitance and a low leakage current. The insulator layer may be between a capacitor bottom metal (CBM) electrode layer and a capacitor top metal (CTM) electrode layer. A thin insulator and/or HK dielectric may be applied to form a high capacitance MIM device.

During fabrication of the MIM device, a portion of the insulator layer may perform as an etch stop during formation of the CTM electrode layer. In such a case, and during etching of the CTM electrode layer, portions of the insulator layer may be thinned such that there is leakage or breakdown between the CBM electrode layer and the CTM electrode layer. Pre-emptively thickening the insulator layer to compensate for the leakage may cause an unetched portion of the insulator layer, between the CBM electrode layer and the CTM electrode layer, to have a thickness that results in a decreased capacitance of the MIM device.

Some implementations described herein provide techniques and apparatuses for forming a semiconductor device including a MIM capacitor. The MIM capacitor includes a dielectric pad layer having a portion between a CBM electrode layer and a portion of an insulator layer. The dielectric pad layer may preserve a thickness of the insulator layer to reduce a likelihood of a leakage between a CTM electrode layer and the CBM electrode layer. The dielectric pad layer may also enable a reduction in a thickness of the insulator layer to increase a capacitance of the MIM capacitor.

In this way, a performance of the MIM capacitor may be increased. Furthermore, in some implementations, the dielectric pad layer performs as an etch stop during formation of a layer stack including the dielectric pad layer, the CBM electrode layer, and the insulator layer to reduce use of an etch tool. In this way, a cost of the semiconductor device including the MIM capacitor may be decreased.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions. In some implementations, the etch tool 108 includes a plasma-based asher to remove a photoresist material.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described in connection with FIGS. 2-7 and elsewhere herein, the semiconductor processing tools 102-112 may perform a combination of operations to form a semiconductor device including a metal-insulator-metal (MIM) capacitor. As an example, the combination of operations includes forming one or more trench regions in a dielectric pad layer covering a first capacitor bottom metal (CBM) electrode layer. In some implementations, the one or more trench regions expose portions of the first CBM electrode layer. The combination of operations further includes forming a second CBM electrode layer on the dielectric pad layer along contours of the or more trench regions. In some implementations, portions of the second CBM electrode layer contact the portions of the first CBM electrode layer.

The combination of operation also includes removing portions of the second CBM electrode layer to expose a top surface region of the dielectric pad layer, forming an insulator layer on the top surface region of the dielectric pad layer and on the second CBM electrode layer, and forming a capping layer on the insulator layer. The combination of operations also includes forming a capacitor top metal (CTM) electrode layer on the capping layer.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
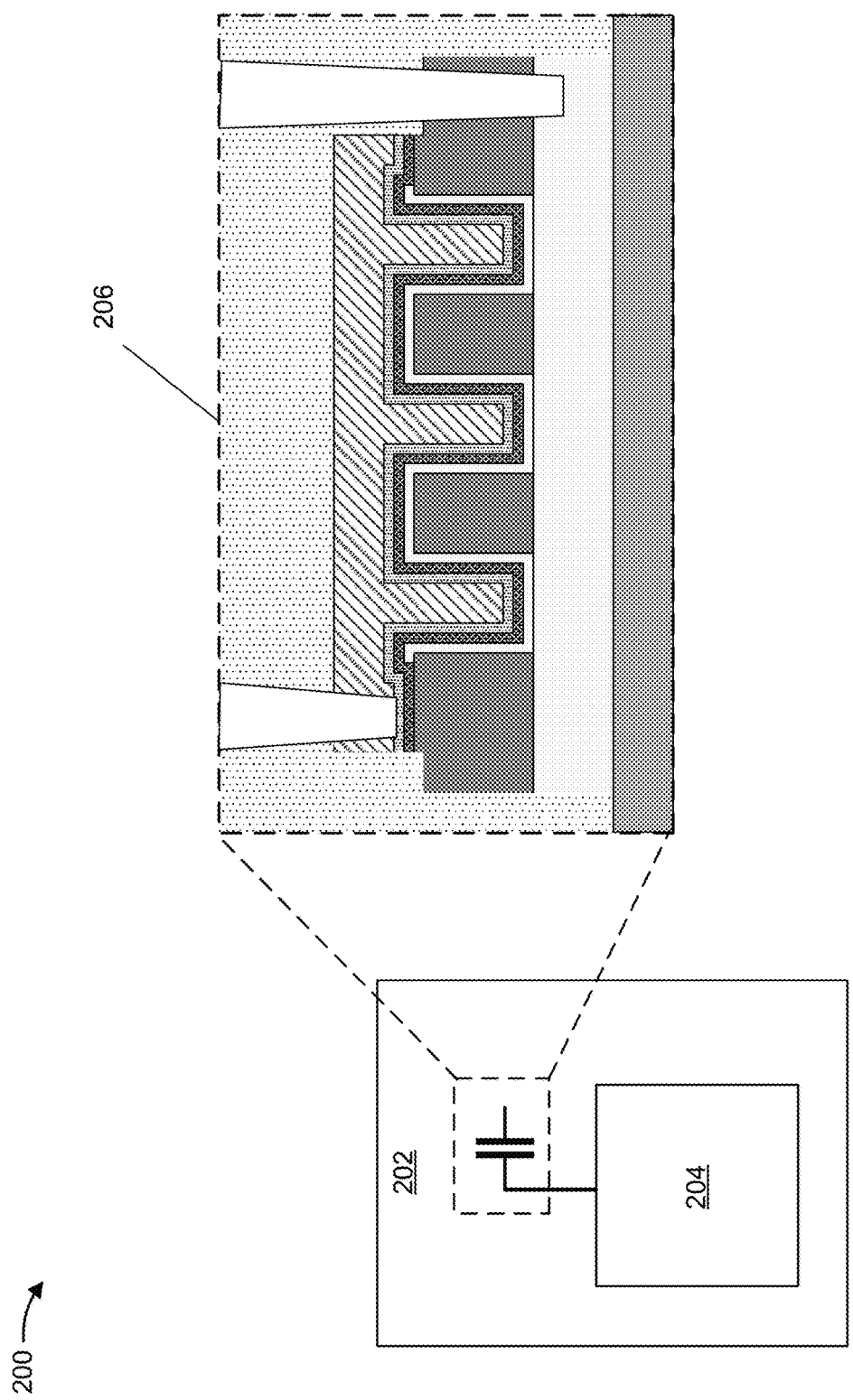
FIG. 2 is a diagram of an example implementation of a semiconductor device described herein.

FIG. 2 is a diagram of an example implementation 200 of a semiconductor device 202 described herein. The semiconductor device 202 may include integrated circuitry 204 electrically coupled to a metal-insulator-metal (MIM) capacitor 206.

As an example, the integrated circuitry 204 may correspond to memory circuitry and the MIM capacitor 206 may correspond to a memory cell. Additionally, or alternatively, the integrated circuitry 204 may correspond to imager circuitry and the MIM capacitor 206 may correspond to a pixel overflow capacitor. Additionally, or alternatively, the integrated circuitry 204 may correspond to transistor circuitry and the MIM capacitor 206 may correspond to a coupling capacitor. However, other types of integrated circuitry (e.g., the integrated circuitry 204) are within the scope of the present disclosure.

As described in connection with FIGS. 3A-7, and elsewhere herein, the semiconductor device 202 may include the integrated circuitry 204 and the MIM capacitor 206. The MIM capacitor 206 includes an insulator layer between a CTM electrode layer and a CBM electrode layer and a dielectric pad layer including a first portion between the CTM electrode layer and the CBM electrode layer. The MIM capacitor 206 includes a first interconnect access structure passing through a second portion of the dielectric pad layer to electrically connect to the CBM electrode layer and a second interconnect access structure passing through the CTM electrode layer to make physical contact with a capping layer. In some implementations, the second interconnect access structure passing through the CTM electrode layer causes the second interconnect access structure to electrically connect to the CTM electrode layer above another portion of the dielectric pad layer. In some implementations, the first interconnect access structure and the second interconnect access structure electrically couple the MIM capacitor 206 to the integrated circuitry 204.

Additionally, or alternatively, the MIM capacitor 206 includes a CTM electrode layer and a CBM electrode layer. The MIM capacitor 206 includes an insulator layer between the CTM electrode layer and the CBM electrode layer. The MIM capacitor 206 includes a dielectric pad layer having a portion between the CTM electrode layer and the CBM electrode layer. The MIM capacitor 206 further includes an interconnect access structure passing through another portion of the dielectric pad layer to electrically connect to the CBM electrode layer.

As indicated above, FIG. 2 is provided as an example. Other examples may differ from what is described with regard to FIG. 2.

FIGS. 3A-3J are diagrams of an example implementation 300 described herein. As described in connection with FIGS. 3A-3J, one or more of the semiconductor processing tools 102-112 may perform a series of operations to form the MIM capacitor 206.

FIG. 3A shows a cross-sectional view of a portion of the MIM capacitor 206, including a dielectric layer 302, a CBM electrode layer 304a (e.g., a first CBM electrode layer), and a dielectric pad layer 306. The dielectric layer 302 may include, as an example, a tantalum nitride (TaN) material, a silicon oxide ($SiO_x$) material, a silicate glass material, a silicon oxycarbide (SiOC) material, a silicon nitride ($Si_xN_y$) material, and/or the like.

The deposition tool 102 may deposit, on the dielectric layer 302, a conductive metal capable of carrying an electric charge such as an aluminum copper (AlCu) material, a titanium (Ti) material, a titanium nitride (TiN) material, a tantalum (Ta) material, a tantalum nitride (TaN) material, or a tungsten (W) material, among other examples, to form the CBM electrode layer 304a. The CBM electrode layer 304a may have a thickness D1 that is included in a range of approximately 5 nanometers to approximately 500 nanometers. However, other values and ranges for the thickness D1 are within the scope of the present disclosure. The deposition tool 102 may deposit the conductive metal to form the CBM electrode layer 304a using a CVD technique, a PVD technique, an ALD technique, a plating technique described above in connection with FIG. 1, and/or another deposition technique.

The deposition tool 102 may deposit, on the CBM electrode layer 304a, one or more materials to form the dielectric pad layer 306. The one or more materials may include a silicon nitride (SiN) material, a silicon dioxide ($SiO_2$) material, a silicon oxynitride (SiON) material, or a silicon oxy carbonitride (SiOCN) material, among other examples. Additionally, or alternatively, the one or more materials may include a high-k dielectric material such as a hafnium oxide ($HfO_2$) material, an aluminum oxide ($Al_2O_3$) material, a zirconium dioxide ($ZrO_2$) material, or a titanium dioxide ($TiO_2$) material, among other examples. However, other materials for the dielectric pad layer 306 are within the scope of the present disclosure. The deposition tool 102 may deposit the one or more materials to form the dielectric pad layer 306 using a CVD technique, a PVD technique, an ALD technique, a plating technique described above in connection with FIG. 1, and/or another deposition technique.

A thickness D2 of the dielectric pad layer 306 may vary based on a configuration of the MIM capacitor 206. As an example, the thickness D2 may be included in a range of approximately 20 nanometers to approximately 2000 nanometers. If the thickness D2 is less than approximately 20 nanometers, gains in capacitance (e.g., capacitor area) from a trench configuration would be minimized (and capacitance would be decreased). Additionally, or alternatively, use of the dielectric pad layer 306 as an etch stop in subsequent manufacturing steps would be compromised, and leakage or breakdown may occur within the MIM capacitor 206. If the thickness is greater than approximately 2000 nanometers, a depth of trench regions in the trench configuration may impede subsequent deposition of an insulator layer, a capping layer, and/or a CTM electrode layer along contours of the trench regions, leading to defects and a decrease in yield of the semiconductor device 202 including the dielectric pad layer 306.

Figure 3B:
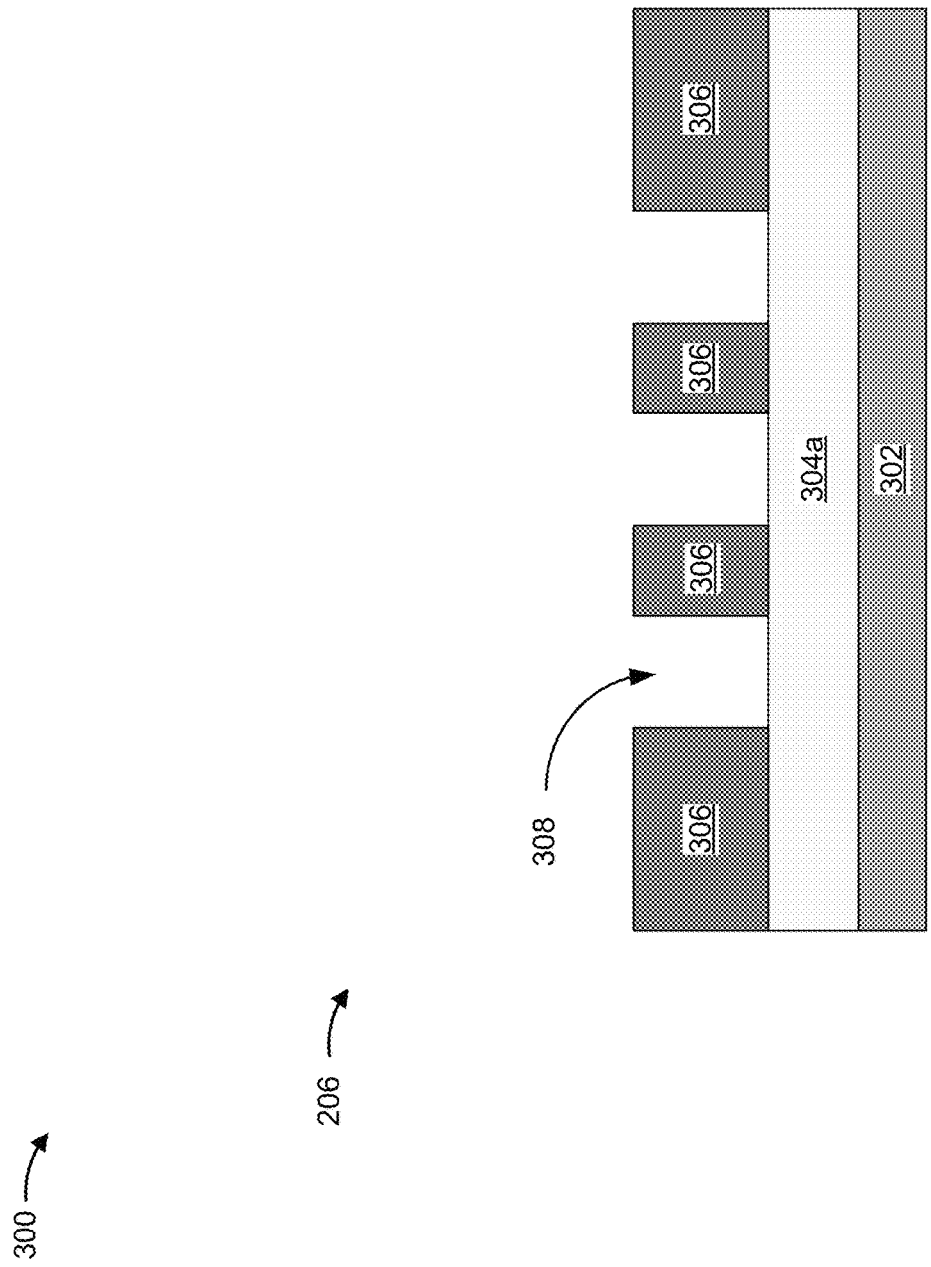

FIG. 3B shows a cross-sectional view including one or more trench regions 308 being formed in the dielectric pad layer 306. In some implementations, the etch tool 108 removes portions of the dielectric pad layer 306 to form the one or more trench regions 308. The etch tool 108 may remove the portions of the dielectric layer 306 using a plasma etch technique, a wet chemical etch technique, and/or another type of etch technique described above in connection with FIG. 1, and/or another etch technique. Forming the one or more trench regions 308 may expose portions of the CBM electrode layer 304a.

Figure 3C:
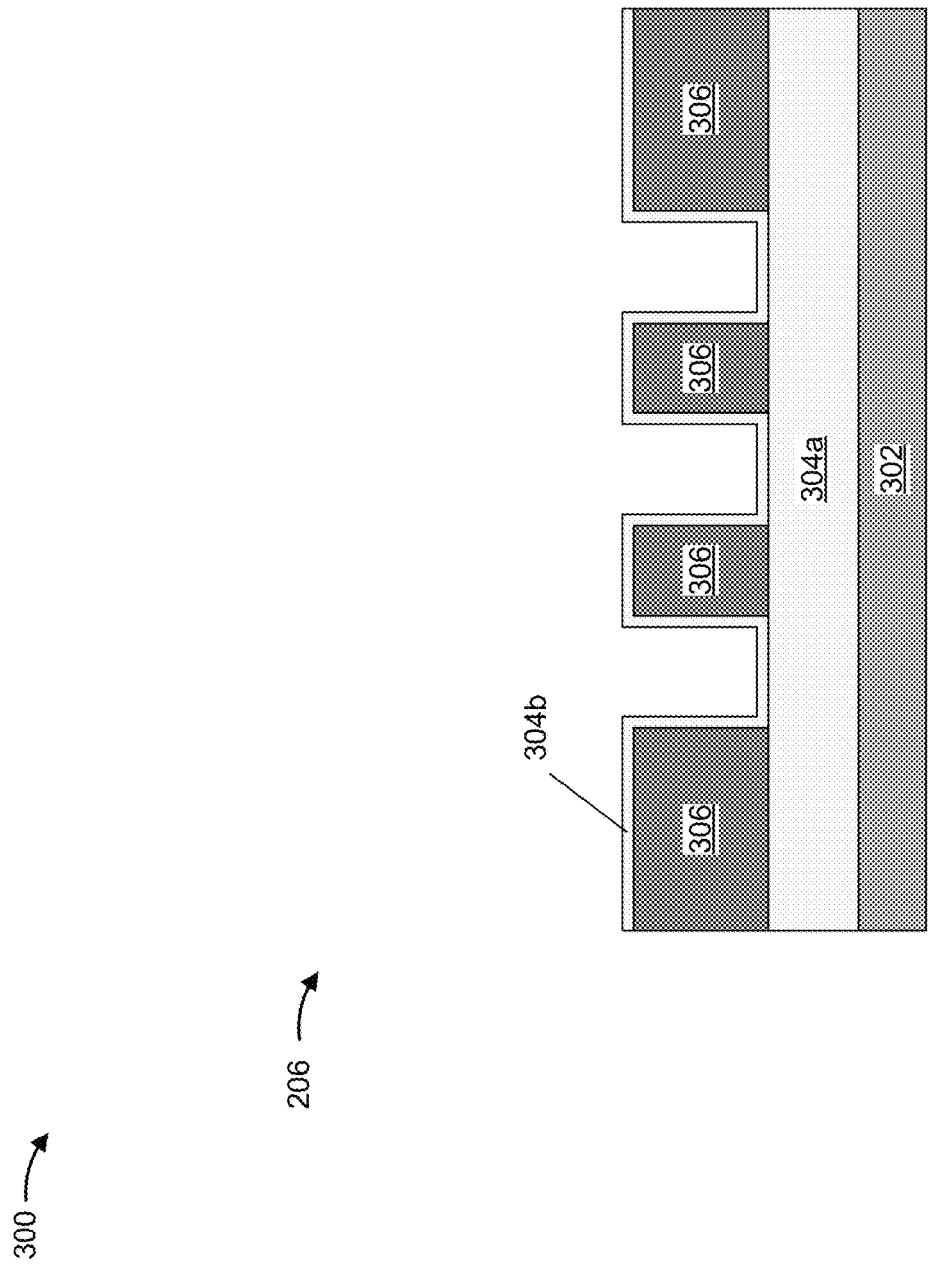

FIG. 3C shows a cross-sectional view including a CBM electrode layer 304b (e.g., a second CBM electrode layer) being formed on the dielectric pad layer 306 and along contours of the one or more trench regions 308. In some implementations, the deposition tool 102 deposits a conductive metal material capable of carrying an electric charge such as an aluminum copper (AlCu) material, a titanium (Ti) material, a titanium nitride (TiN) material, a tantalum (Ta) material, a tantalum nitride (TaN) material, or a tungsten (W) material, among other examples, to form the CBM electrode layer 304b. However, other conductive metal materials are within the scope of the present disclosure. The CBM electrode layer 304b may electrically connect with the CBM electrode layer 304a at the bottom of the one or more trench regions 308. The deposition tool 102 may deposit the conductive metal material to form the CBM electrode layer 304b using a CVD technique, a PVD technique, an ALD technique, a plating technique described above in connection with FIG. 1, and/or another deposition technique.

Figure 3D:
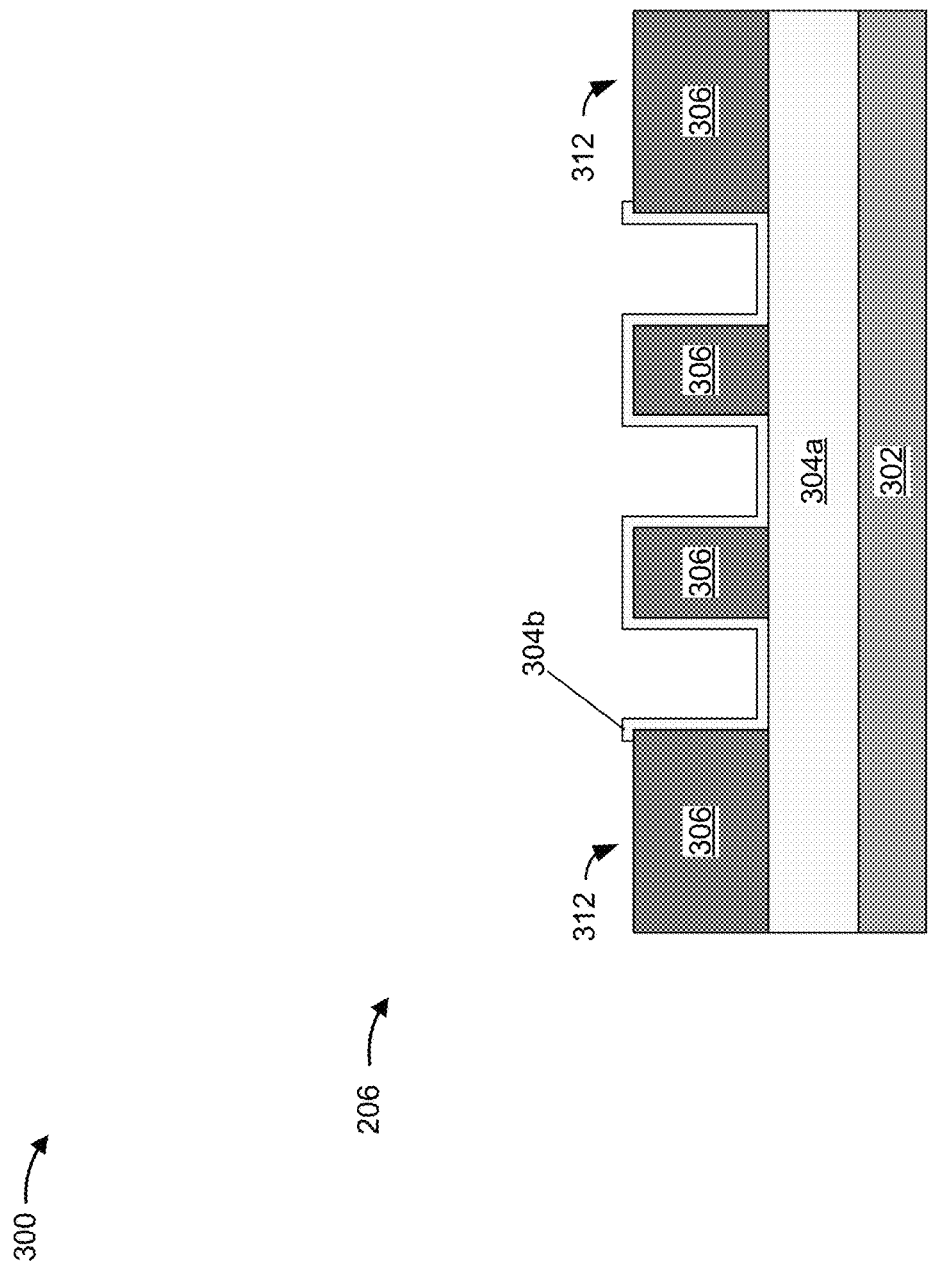

FIG. 3D shows a cross-sectional view including portions of the CBM electrode layer 304b being removed to expose one or more top surface regions 312 of the dielectric pad layer 306. In some implementations the etch tool 108 removes the portions of the CBM electrode layer 304b to expose the one or more top surface regions 312. The etch tool 108 may remove the portions of the CBM electrode layer 304b using a plasma etch technique, a wet chemical etch technique, and/or another type of etch technique described above in connection with FIG. 1, and/or another etch technique.

Figure 3E:
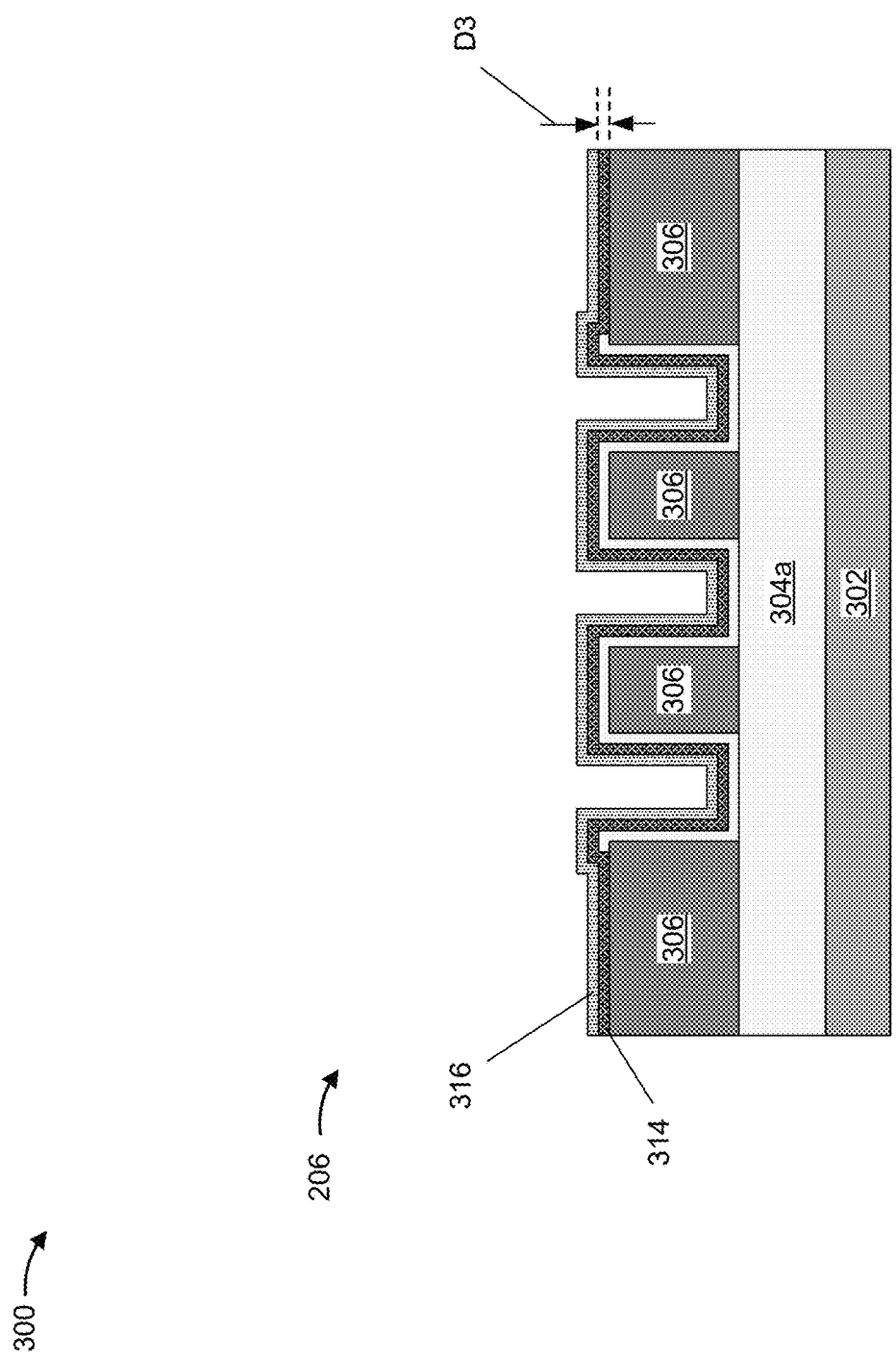

FIG. 3E shows a cross-sectional view including an insulator layer 314 being formed on the one or more top surface regions 312 and on the CBM electrode layer 304b. The insulator layer 314, as shown, includes a shape that conforms to the one or more trench regions 308. In some implementations, the deposition tool 102 deposits one or more or more materials to form the insulator layer 314. The one or more materials may include a silicon nitride (SiN) material, a silicon dioxide ($SiO_2$) material, or a silicon oxy carbonitride (SiOCN) material, among other examples. Additionally, or alternatively, the one or more materials may include a high-k dielectric material such as a hafnium oxide ($HfO_2$) material, an aluminum oxide ($Al_2O_3$) material, a zirconium dioxide ($ZrO_2$) material, or a titanium dioxide ($TiO_2$) material, among other examples. However, other materials for the insulator layer 314 are within the scope of the present disclosure. The deposition tool 102 may deposit the one or more materials to form the insulator layer 314 using a CVD technique, a PVD technique, an ALD technique, a plating technique described above in connection with FIG. 1, and/or another deposition technique.

The insulator layer 314 may include a thickness D3. As an example, the thickness D3 may be included in a range of approximately 1 nanometer to approximately 100 nanometers. If the thickness D3 is less than approximately 1 nanometer, uniformity of deposition of the insulator layer 314 throughout the one or more trench regions 308 might be impeded, leading to voids and/or defects between the dielectric pad layer 306 and the insulator layer 314 to decrease a yield of the semiconductor device 202 including the insulator layer 314. If the thickness D3 is greater than approximately 100 nanometers, a capacitance of the MIM capacitor 206 might be reduced to decrease a performance of the semiconductor device 202 including the insulator layer 314. However, other values and ranges for the thickness D3 are within the scope of the present disclosure.

In some implementations, and as shown in the cross-sectional view of FIG. 3E, a capping layer 316 is formed on the insulator layer 314. For example, the deposition tool 102 may deposit a tungsten (W) material, among other examples, to form the capping layer 316. This structure of including the insulator layer 314 between the capping layer 316 and the dielectric pad layer 306, as shown in FIG. 3E, may preserve a thickness of the insulator layer 314 during subsequent manufacturing steps to reduce a likelihood of leakage (e.g., leakage between the CBM electrode layers 304a, 304b and a subsequently formed CTM electrode layer) within the MIM capacitor 206. Additionally, the thickness D3 of the insulator layer 314 may be tightly controlled to achieve a desired capacitance performance of the MIM capacitor 206. The deposition tool 102 may form the insulator layer 314 using a CVD technique, a PVD technique, an ALD technique, a plating technique described above in connection with FIG. 1, and/or another deposition technique.

Figure 3F:
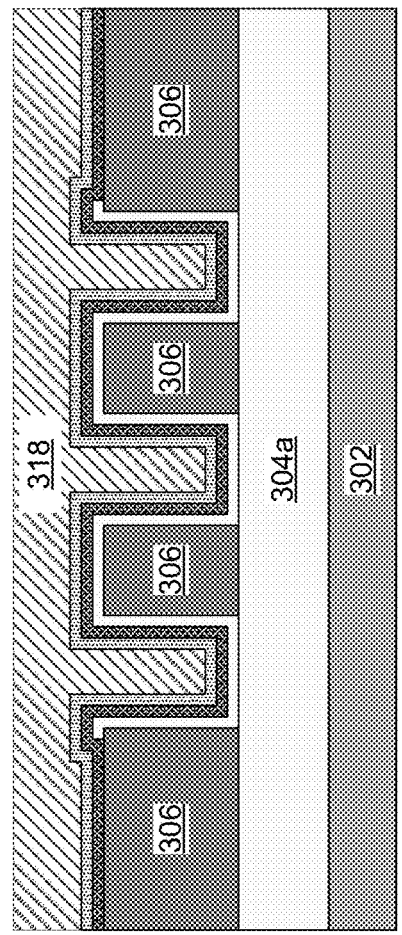

FIG. 3F shows a cross-sectional view including formation of a CTM electrode layer 318 on the capping layer 316. In some implementations, the deposition tool 102 deposits a conductive metal capable of carrying an electric charge such as an aluminum copper (AlCu) material, a titanium (Ti) material, a titanium nitride (TiN) material, a tantalum (Ta) material, a tantalum nitride (TaN) material, or a tungsten (W) material, among other examples, to form the CTM electrode layer 318. The deposition tool 102 may deposit the conductive metal to form the CTM electrode layer 318 using a CVD technique, a PVD technique, an ALD technique, a plating technique described above in connection with FIG. 1, and/or another deposition technique.

Figure 3G:
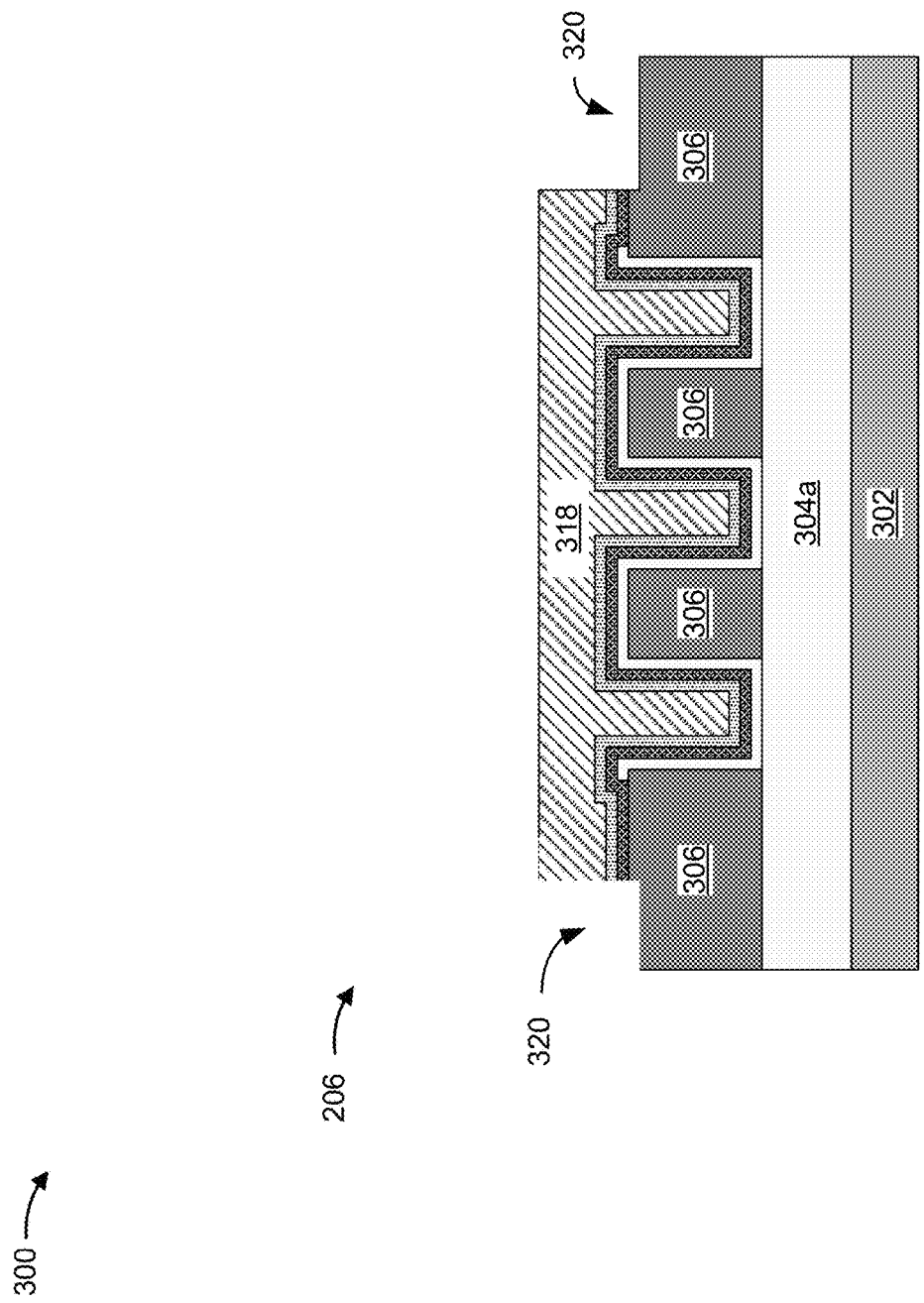

FIG. 3G shows a cross-sectional view including removal of portions of the CTM electrode layer 318, the capping layer 316, the insulator layer 314, and the dielectric pad layer 306 to expose one or more recessed surface regions 320 of the dielectric pad layer 306. For example, the etch tool 108 may perform one or more etching operations to remove the portions of the CTM electrode layer 318, the capping layer 316, and/or the insulator layer 314 to expose the one or more surface regions 320 of the dielectric pad layer 306. The etch tool 108 may perform the one or more etching operations using a plasma etch technique, a wet chemical etch technique, and/or another type of etch technique described above in connection with FIG. 1, and/or another etch technique. After removal of the portions of the CTM electrode layer 318, the capping layer 316, the insulator layer 314, and/or the dielectric pad layer 306, edges of the insulator layer 314 and the capping layer 316 are aligned (e.g., "self-aligned") to edges of the CTM electrode layer 318.

As shown in FIG. 3G, the dielectric pad layer 306 may perform as an etch stop during the removal of the portions of the CTM electrode layer 318, the capping layer 316, and the insulator layer 314. In this way, utilization of the etch tool 108 may be increased (e.g., eliminating multiple etch cycles and/or etch recipes) to reduce a cost of the semiconductor device 202 including the MIM capacitor 206.

Figure 3H:
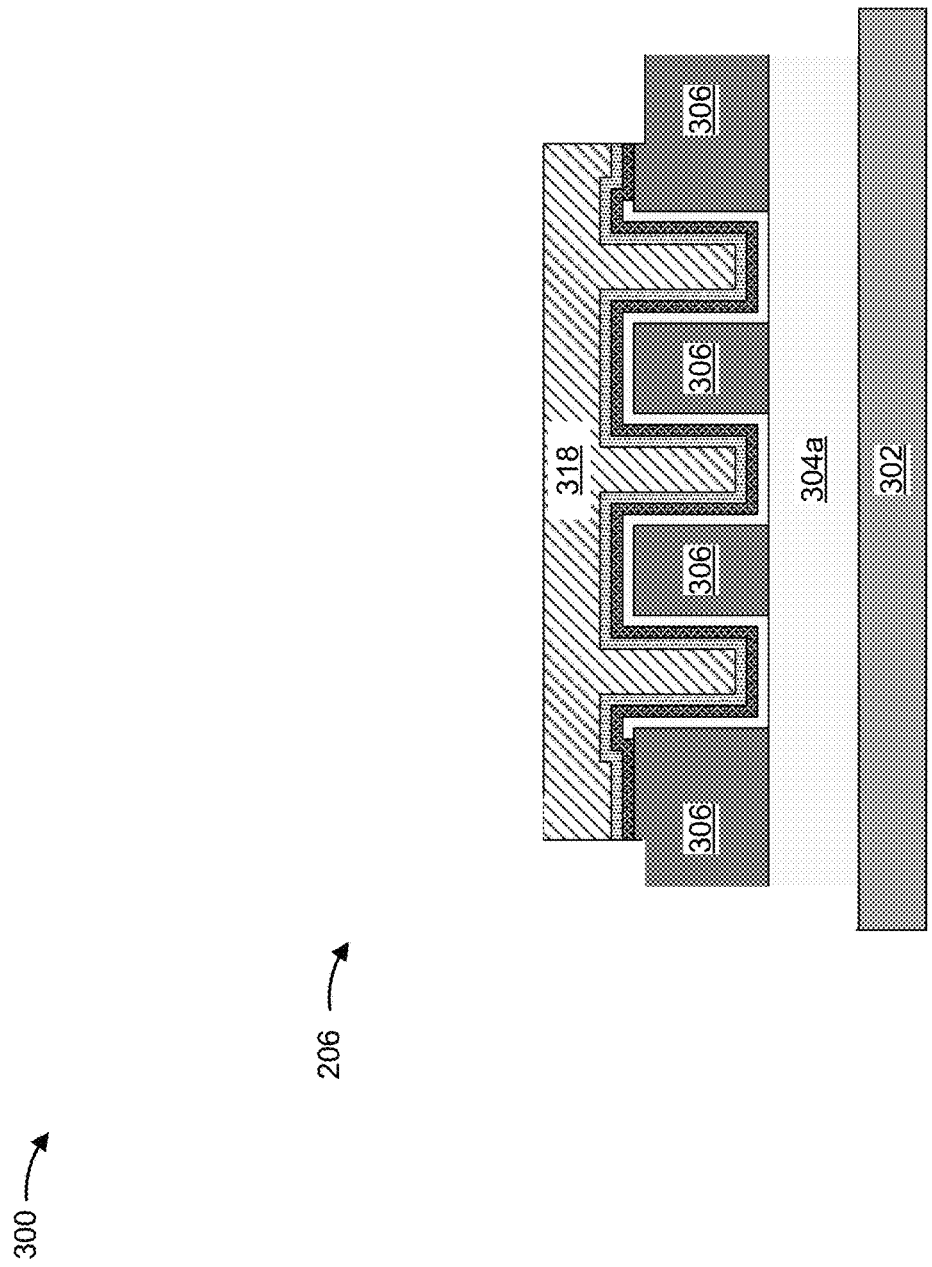

In some implementations, and as shown in the cross-sectional view of FIG. 3H, other portions of the dielectric pad layer 306 and portions of the CBM electrode layer 304a may be removed. For example, the etch tool 108 may perform one or more etching operations to remove the other portions of the dielectric pad layer 306 and the portions of the CBM electrode layer 304a to create one or more regions for deposition of an inter-layer dielectric (ILD) layer included the MIM capacitor 206. The etch tool 108 may perform the one or more etching operations using a plasma etch technique, a wet chemical etch technique, and/or another type of etch technique described above in connection with FIG. 1, and/or another etch technique.

Figure 3I:
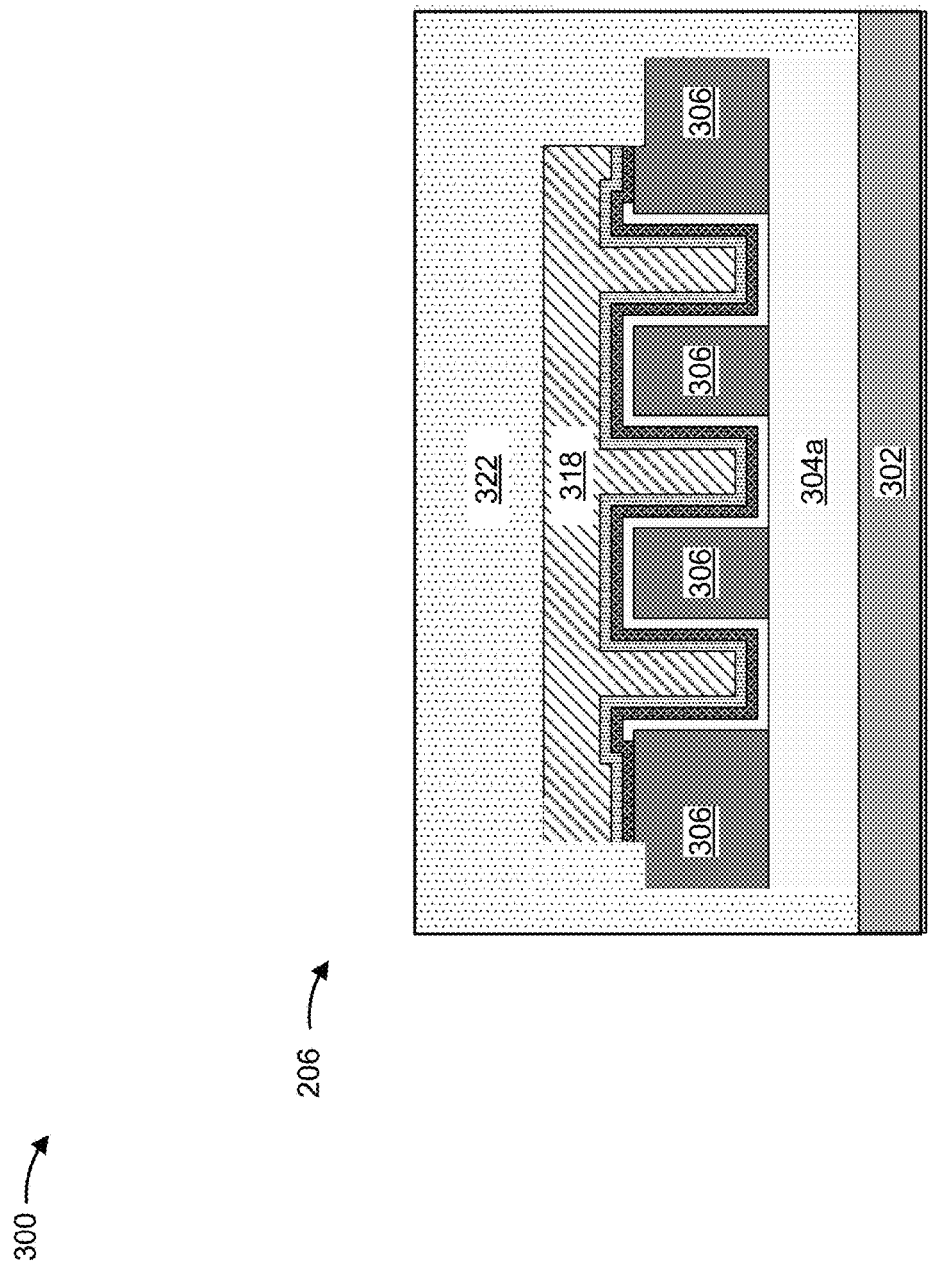

FIG. 3I shows a cross-sectional view including deposition of an ILD layer 322 included in the MIM capacitor 206. For example, the deposition tool 102 may deposit a silicon nitride (SiN) material, a silicon dioxide (SiO$_2$) material, or a silicon oxy carbonitride (SiOCN) material, among other examples, to form the ILD layer 322. However, other materials for the ILD layer 322 are within the scope of the present disclosure. The ILD layer 322 may provide electrical isolation between one or more layers of the MIM capacitor 206. The deposition tool 102 may deposit the ILD layer 322 using a CVD technique, a PVD technique, an ALD technique, a plating technique described above in connection with FIG. 1, and/or another deposition technique.

Figure 3J:
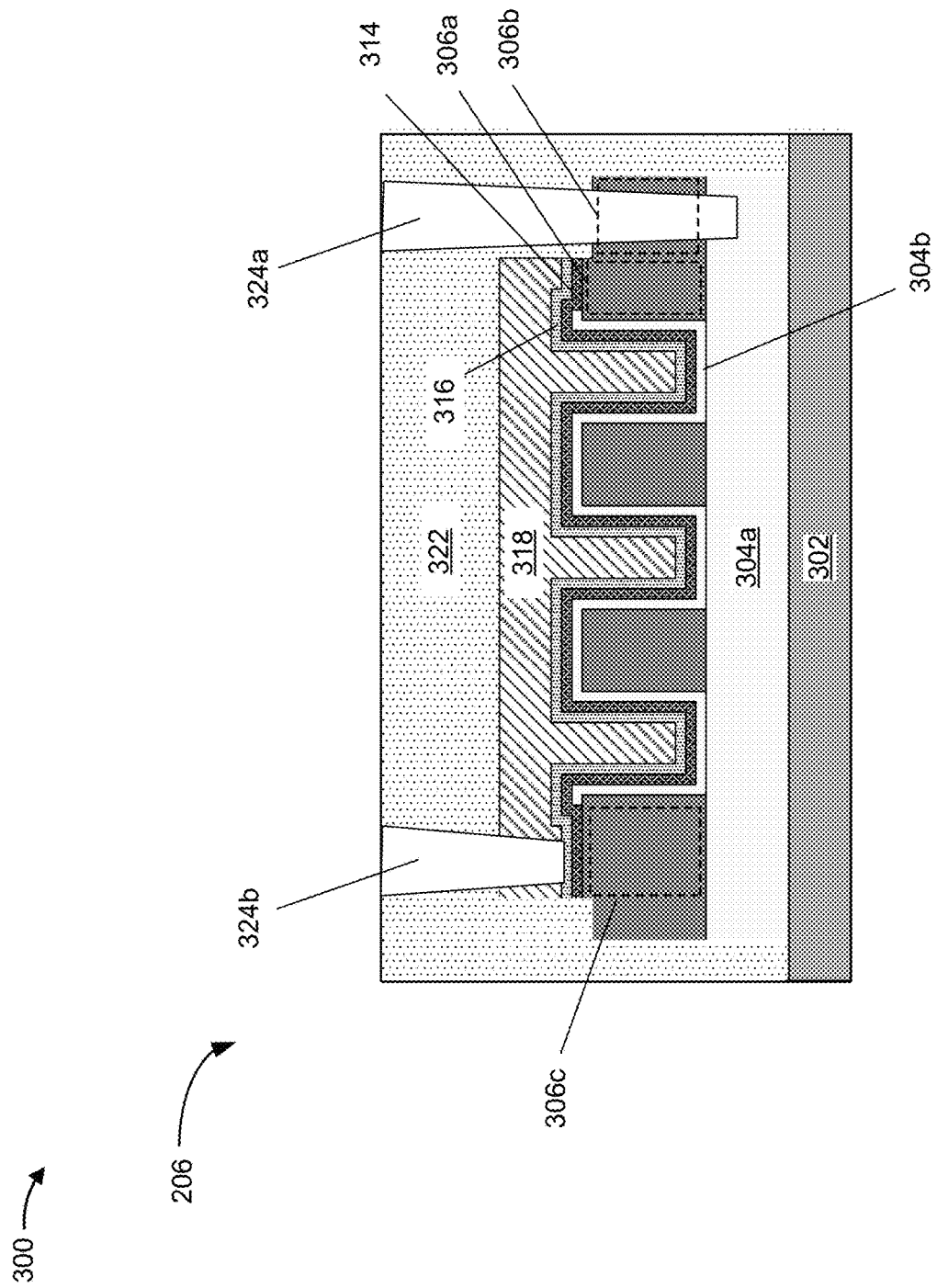

FIG. 3J shows a cross-sectional view including formation of interconnect access structures 324 (e.g., vertical interconnect access structures, or "vias") through the ILD layer 322 (shown as interconnect access structure 324a and interconnect access structure 324b in FIG. 3J). For example, the etch tool 108 may form recesses (e.g., cavities) within the ILD layer 322 and the deposition tool 102 may deposit an electrically conductive material (e.g., copper (Cu) or tungsten (W), among other examples) within the recesses to form the interconnect access structures 324. The etch tool 108 may form the recesses using a plasma etch technique, a wet chemical etch technique, and/or another type of etch technique described above in connection with FIG. 1, and/or another etch technique. The deposition tool may deposit the electrically conductive material to form the interconnect access structures using a CVD technique, a PVD technique, an ALD technique, a plating technique described above in connection with FIG. 1, and/or another deposition technique. The interconnect access structures 324 may provide an electrically conductive path to electrically couple the MIM capacitor 206 to integrated circuitry of the semiconductor device 202 (e.g., the integrated circuitry 204).

As shown in FIG. 3J, the MIM capacitor 206 includes the CTM electrode layer 318 and the CBM electrode layer 304a. The MIM capacitor 206 further includes the insulator layer 314 between the CTM electrode layer 318 and the CBM electrode layer 304a. The MIM capacitor 206 includes the dielectric pad layer 306, including a portion 306a between the CTM electrode layer 318 and the CBM electrode layer 304a. As shown in FIG. 3J, the portion 306a of the dielectric pad layer 306 is below a portion of the insulator layer 314.

FIG. 3J shows additional aspects of the MIM capacitor 206, including the capping layer 316 between the CTM electrode layer 318 and the insulator layer 314. FIG. 3J further shows edges of the insulator layer 314 aligned to edges of the CTM electrode layer 318.

The MIM capacitor 206 includes the interconnect access structure 324a (e.g., corresponding to a first interconnect access structure) passing through another portion 306b of the dielectric pad layer 306 to electrically connect to the CBM electrode layer 304a. The MIM capacitor 206 includes the interconnect access structure 324b (e.g., corresponding to a second interconnect access structure) passing through the CTM electrode layer 318 to make physical contact with the capping layer 316. In some implementations, and as shown, the interconnect access structure 324b passing through the CTM electrode layer 318 causes the interconnect access structure 324b to electrically connect to the CTM electrode layer 318 above another portion 306c of the dielectric pad layer 306.

The number and arrangement of layers as shown in FIGS. 3A-3J are provided as one or more examples. In practice, and as described in connection with FIGS. 4A-5H, there may be additional layers, different layers, or differently arranged layers than those shown in FIGS. 3A-3J. Furthermore, different combinations of layers, arrangements of layers, or materials included in the MIM capacitor 206 may be implemented within a single semiconductor device 202.

FIGS. 4A-4G are diagrams of an example implementation 400 described herein. The example implementation 400 may use similar fabrication techniques and materials as described in connection with the example implementation 300 of FIGS. 3A-3J to form the MIM capacitor 206. However, in contrast to the example implementation 300 of FIGS. 3A-3J, multiple trench regions are absent from MIM capacitor 206.

Figure 4A:
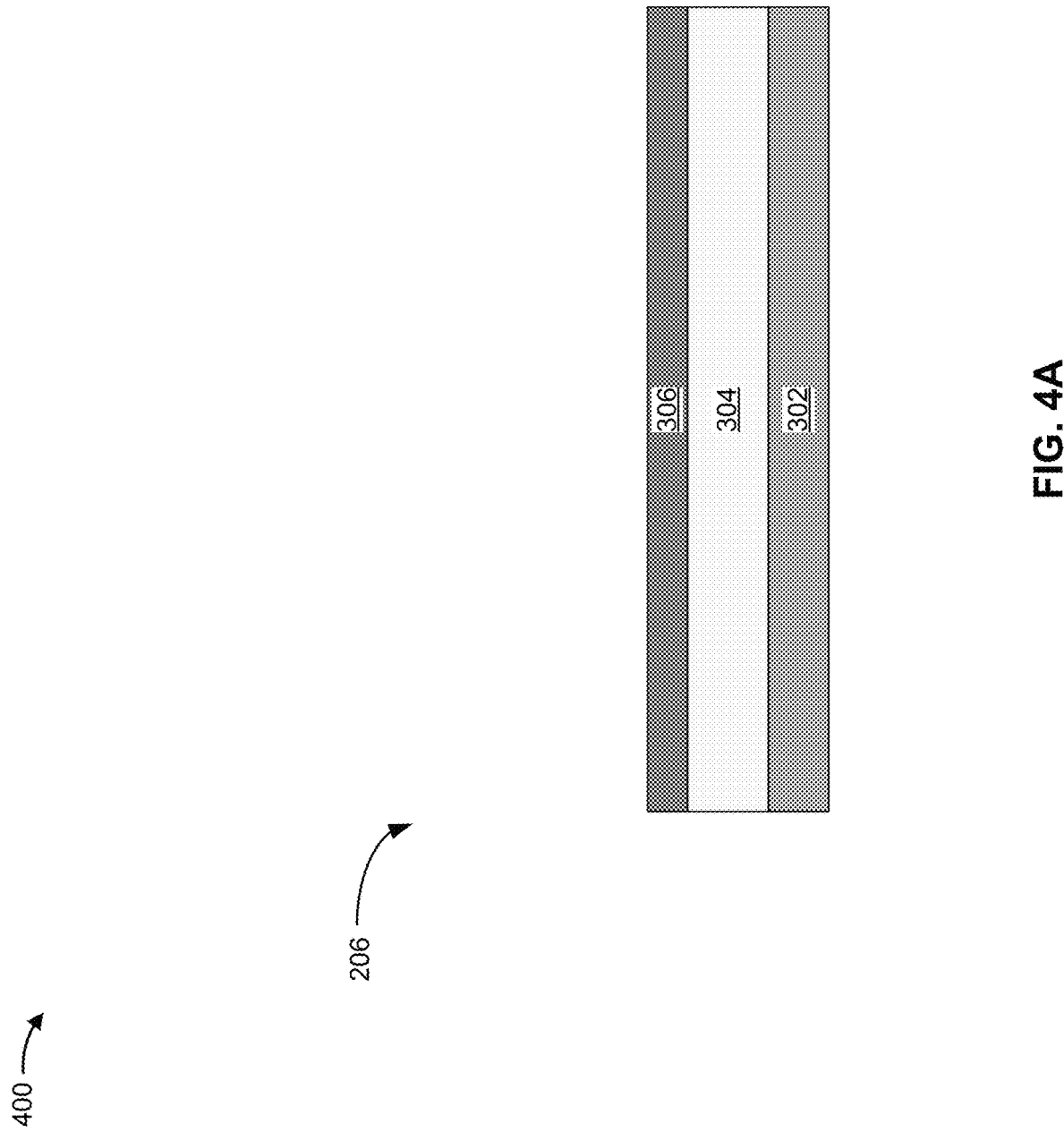
FIGS. 4A, 4B, 4C, 4D, 4E, 4F, and 4G are diagrams of example implementations described herein.
Figure 4B:
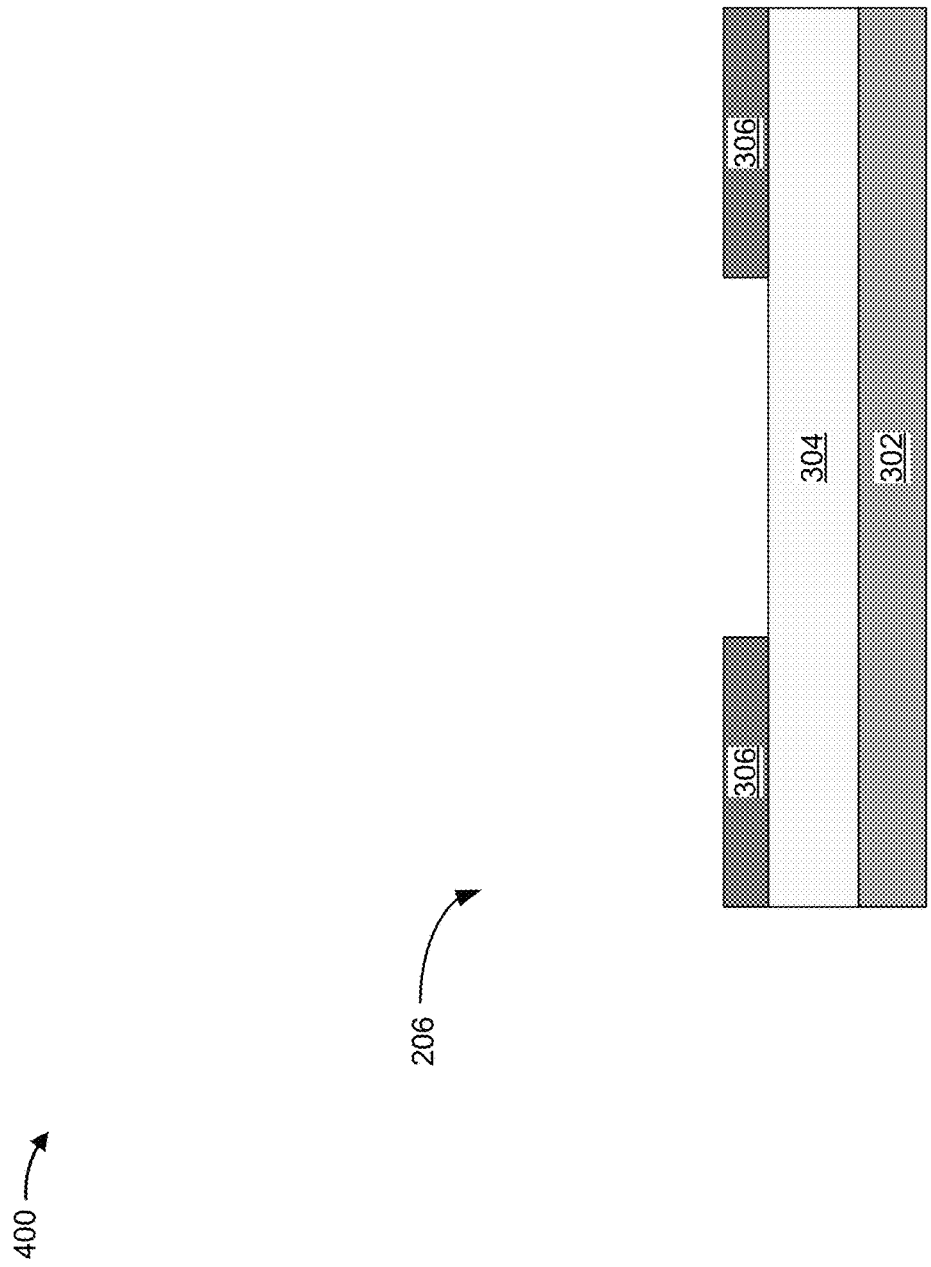

Cross-sectional views of FIGS. 4A and 4B show formation of the dielectric layer 302, the CBM electrode layer 304, and the dielectric pad layer 306. In contrast to the example implementation of FIGS. 3A-3J, the implementation 400 includes a single CBM electrode layer 304 (implementation 300 of FIGS. 3A-3J include two CBM electrode layers, e.g., the CBM electrode layer 304a and the CBM electrode layer 304b).

Figure 4C:
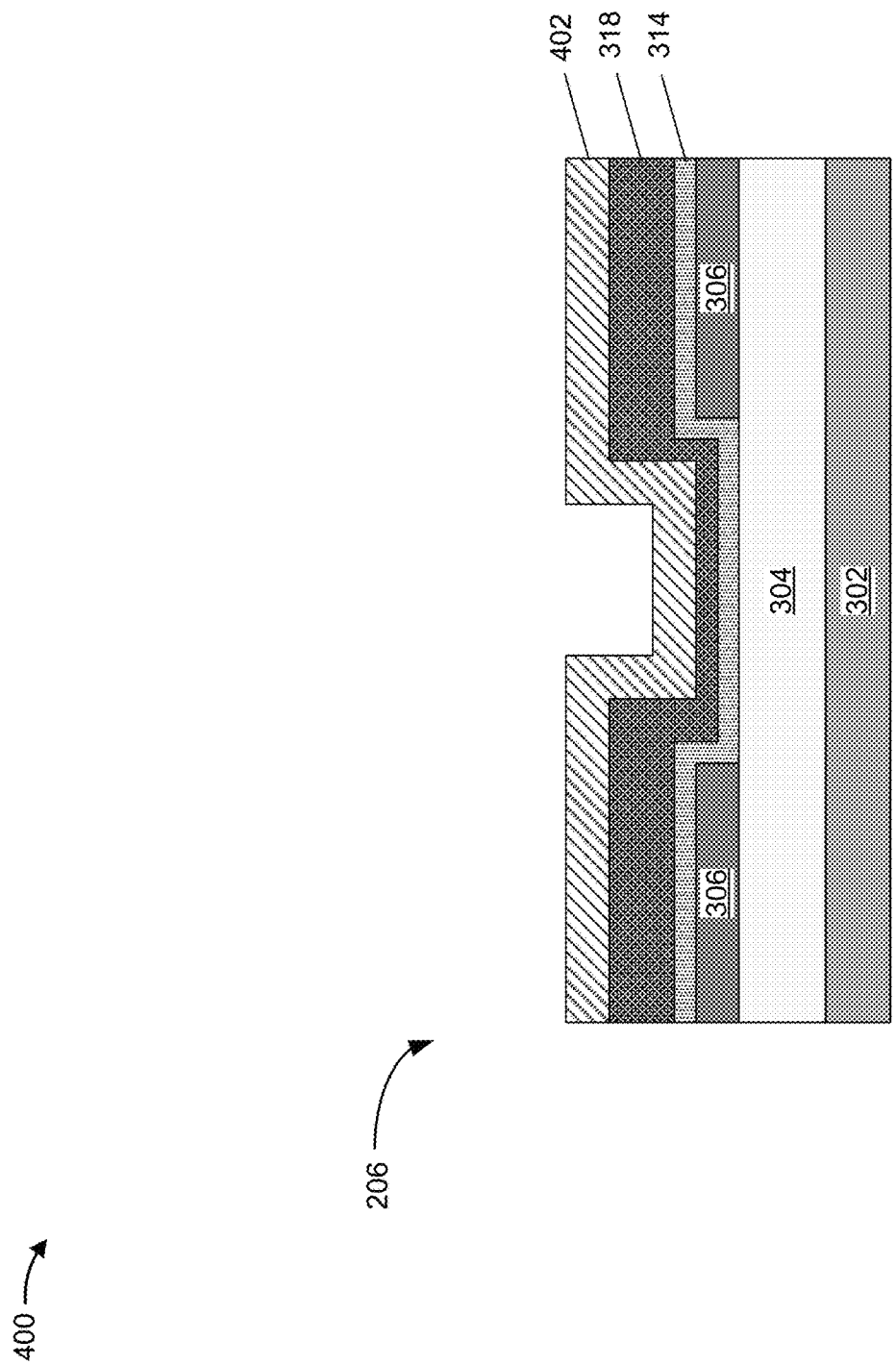
Figure 4D:
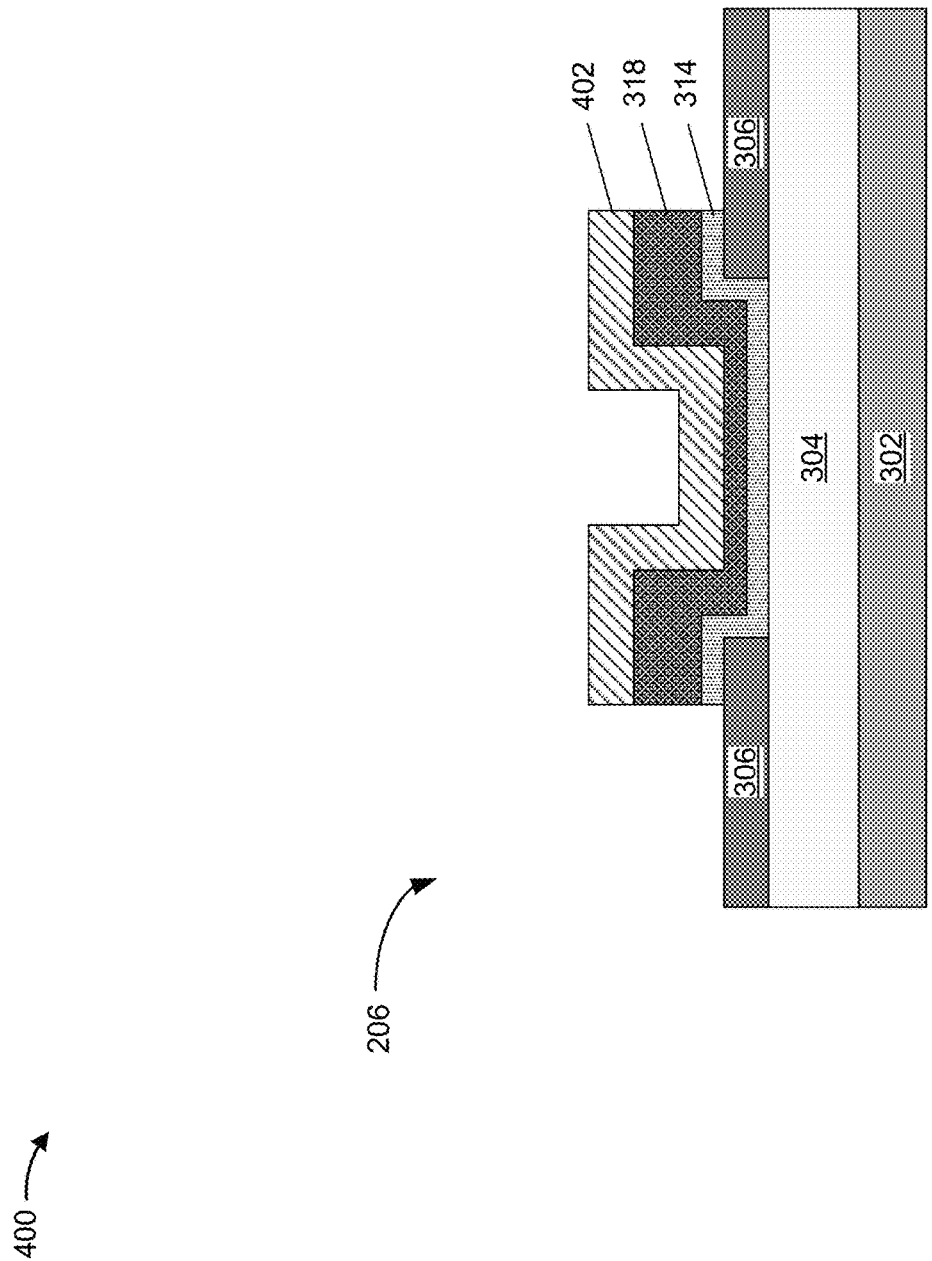
Figure 4E:
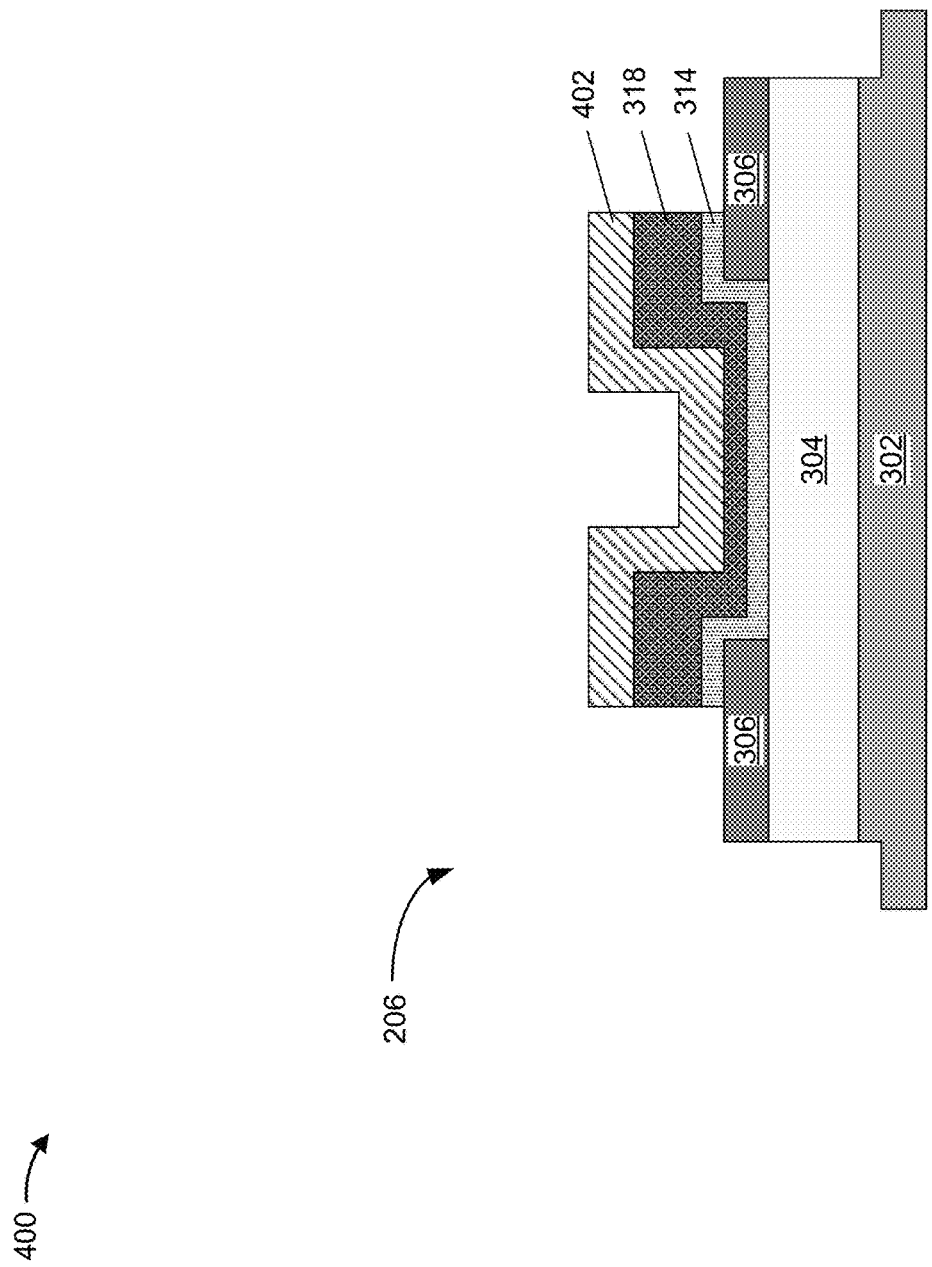

Cross-sectional views of FIGS. 4C-4E show formation of the insulator layer 314, the CTM electrode layer 318, and a dielectric layer 402. The dielectric layer 402 may include, for example, a silicon nitride (SiN) material, a silicon dioxide (SiO$_2$) material, or a silicon oxy carbonitride (SiOCN), among other examples. However, other materials for the dielectric layer 402 are within the scope of the present disclosure.

As shown in FIG. 4D, the dielectric pad layer 306 may perform as an etch stop during removal of portions of the dielectric layer 402, CTM electrode layer 318, and the insulator layer 314. In this way, a utilization of the etch tool 108 may be increased (e.g., eliminating multiple etch cycles and/or etch recipes) to reduce a cost of the semiconductor device 202 including the MIM capacitor 206.

In some implementations, and as shown in FIG. 4E, this structure of including the insulator layer 314 between the CTM electrode layer 318 and the dielectric pad layer 306 may preserve a thickness of the insulator layer 314 during subsequent manufacturing steps to reduce a likelihood of leakage between the CTM electrode layer 318 and the CBM electrode layer 304 within the MIM capacitor 206. Additionally, a thickness of the insulator layer 314 may be tightly controlled to achieve a desired capacitance performance of the MIM capacitor 206.

Figure 4F:
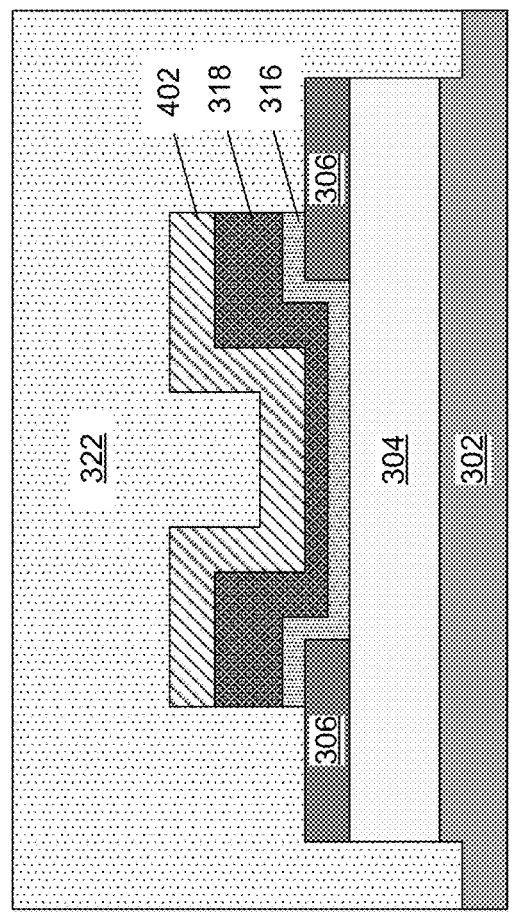
Figure 4G:
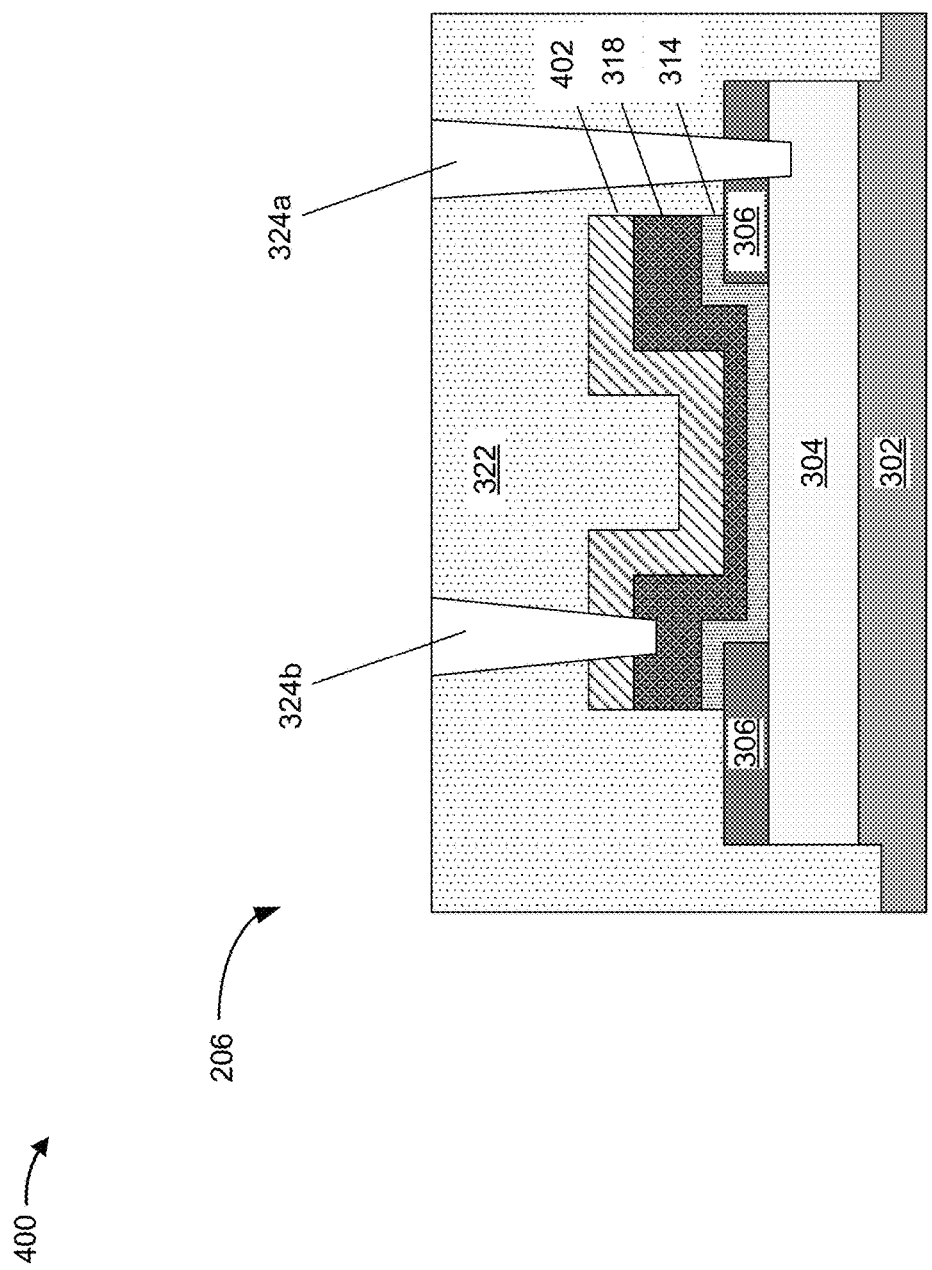

FIGS. 4F and 4G show cross-sectional views that include formation of the ILD layer 322 and the interconnect access structures 324. The ILD layer 322 may provide electrical isolation between one or more layers of the MIM capacitor 206. The interconnect access structures 324 (e.g., interconnect access structure 324a and interconnect access structure 324b) may provide an electrically conductive path to electrically couple the MIM capacitor 206 to integrated circuitry of the semiconductor device 202 (e.g., the integrated circuitry 204).

Similar to the MIM capacitor 206 formed using techniques described in connection with FIGS. 3A-3J, a portion of the dielectric pad layer 306 between the CTM electrode layer 318 and the CBM electrode layer 304 is below a portion of the insulator layer 314.

As indicated above, FIGS. 4A-4G are provided as examples. Other examples may differ from what is described with regard to FIGS. 4A-4G.

FIGS. 5A-5H are diagrams of an example implementation 500 described herein. The example implementation 500 may use similar fabrication techniques and materials as described in connection with the example implementation 300 of FIGS. 3A-3J to form the MIM capacitor 206. However, in contrast to the example implementation 300 of FIGS. 3A-3J, and/or the example implementation 400 of FIGS. 4A-4G, implementation 500 includes the insulator layer 314 being formed prior to the dielectric pad layer 306.

Figure 5A:
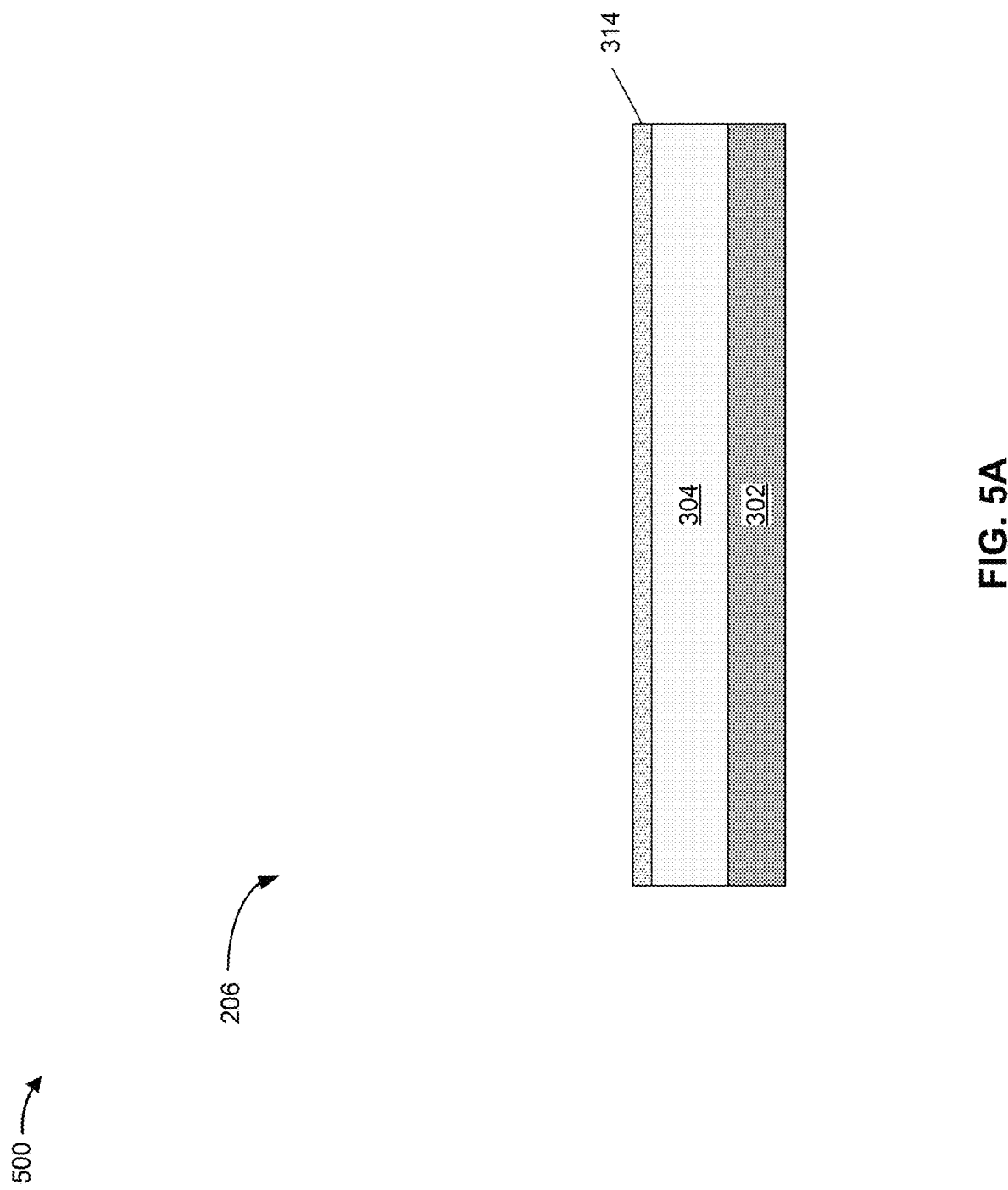
FIGS. 5A, 5B, 5C, 5D, 5E, 5F, 5G, and 5H are diagrams of example implementations described herein.
Figure 5B:
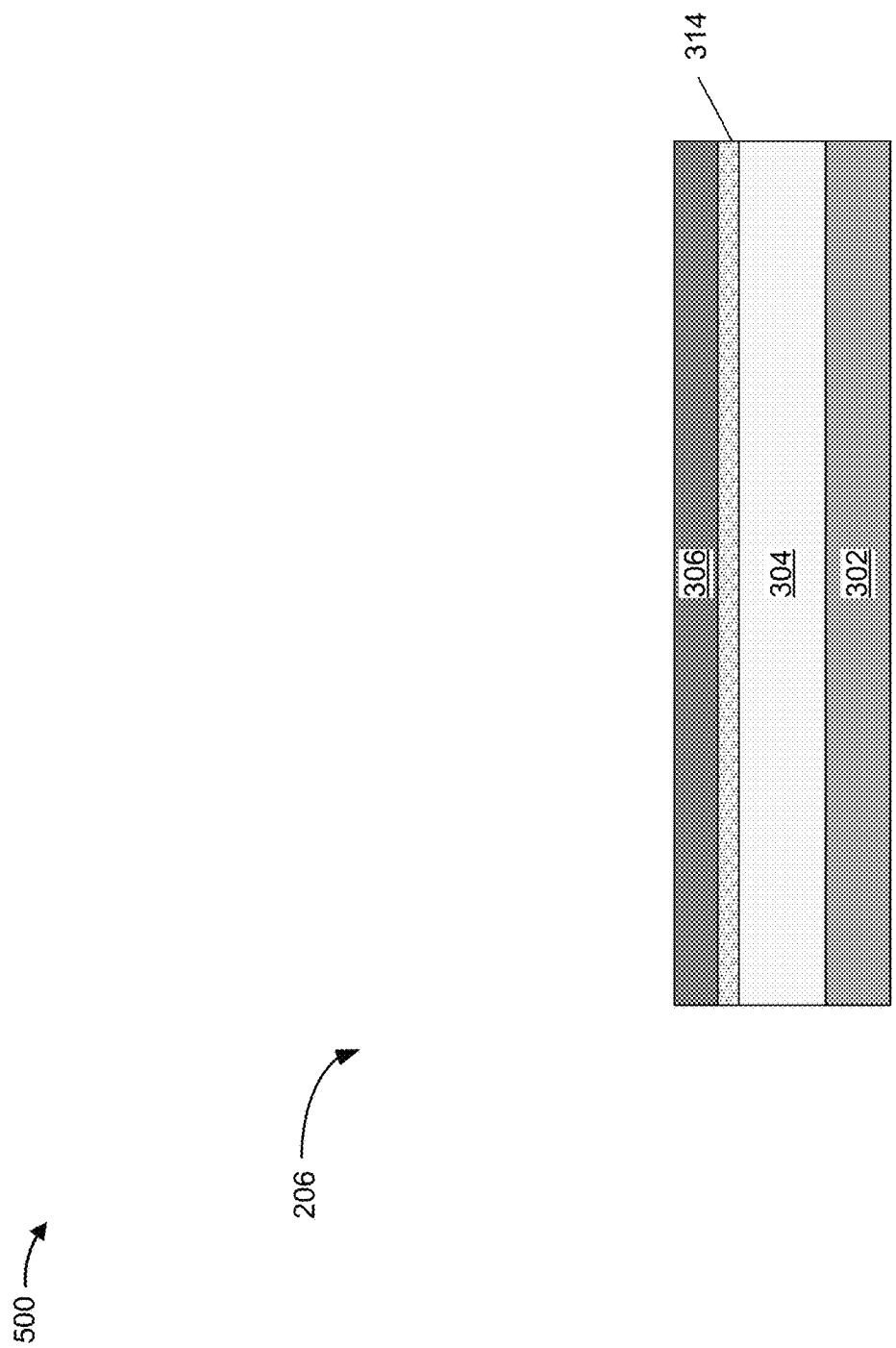
Figure 5C:
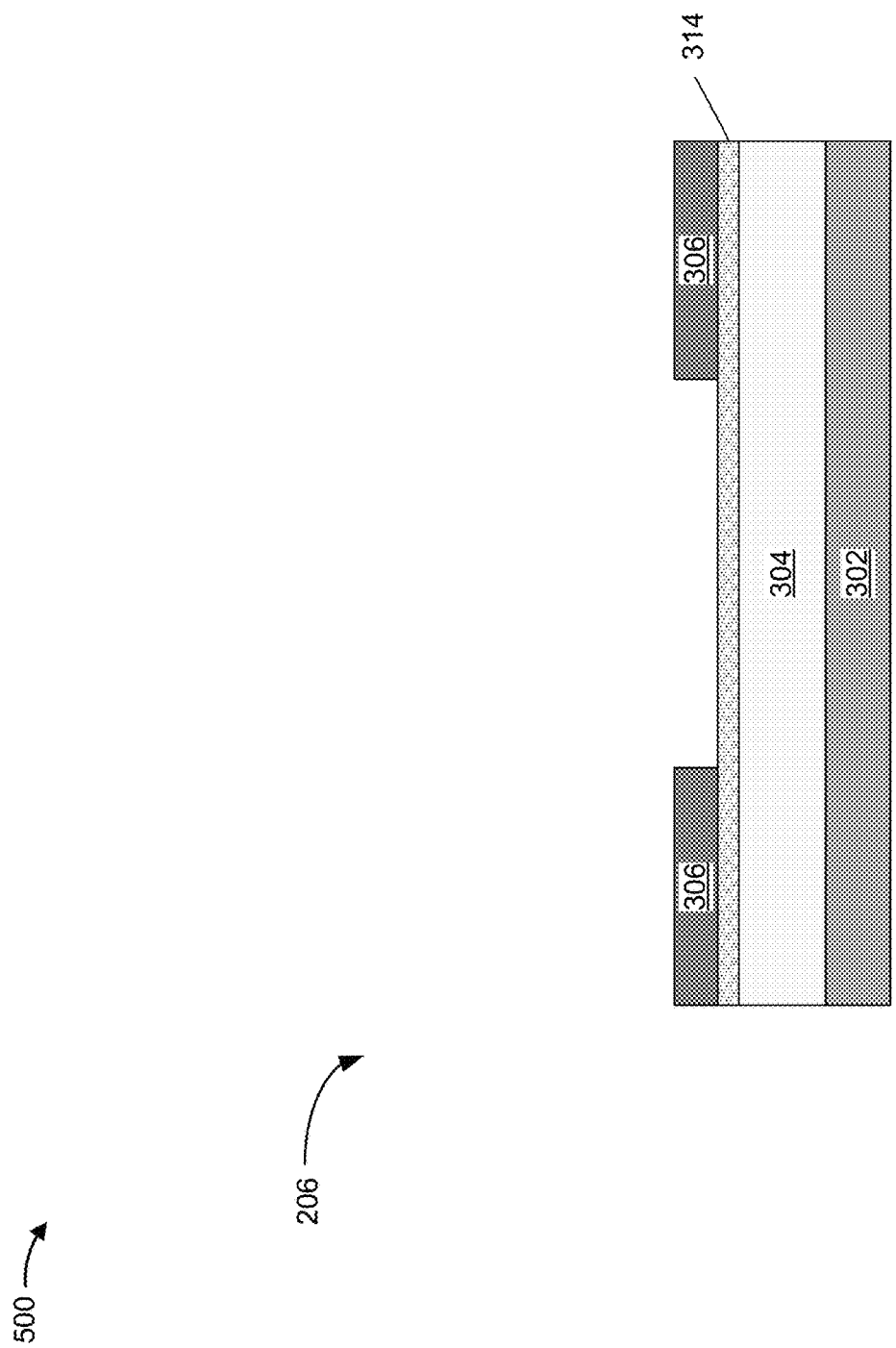
Figure 5D:
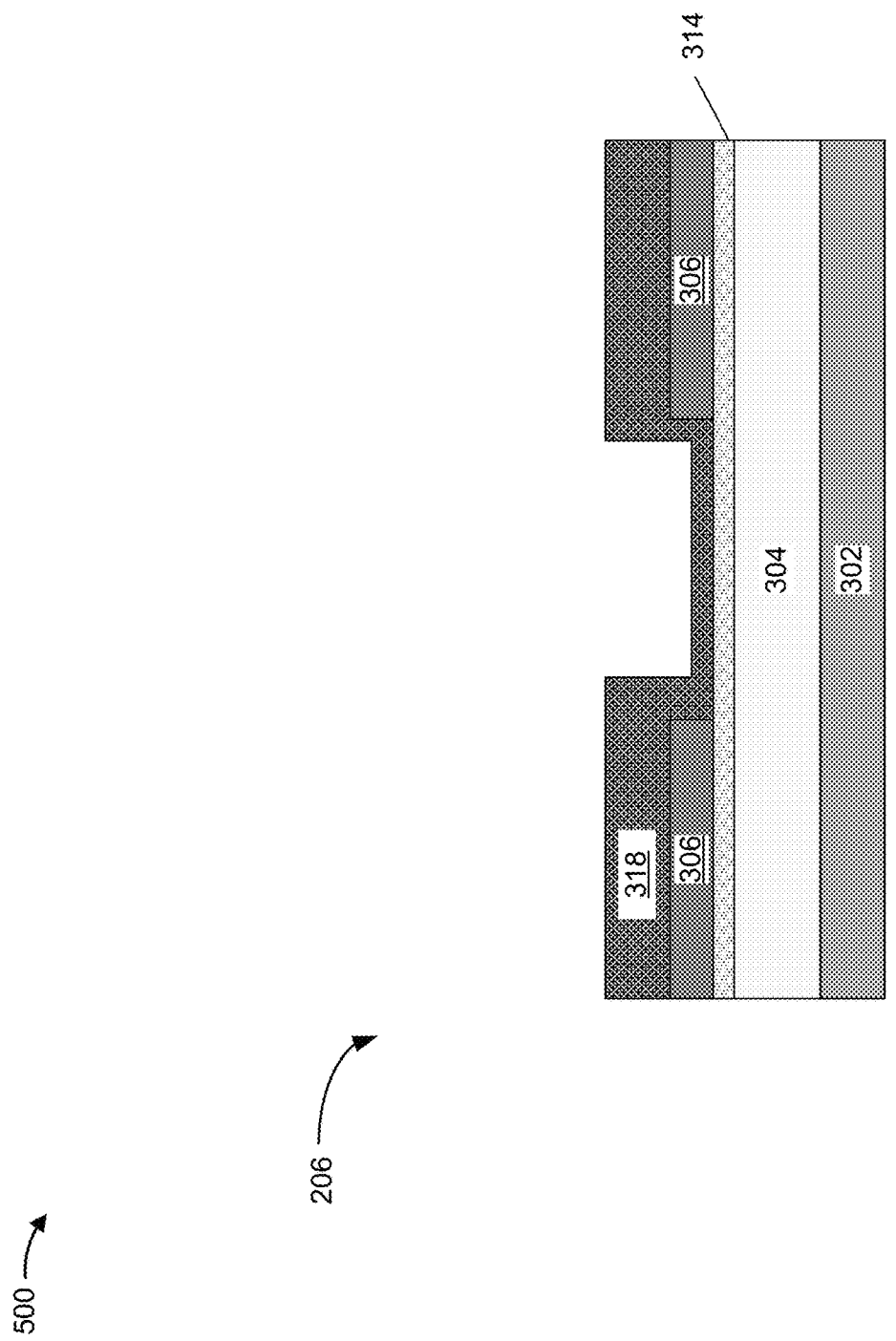

Cross-sectional views of FIGS. 5A-5C show formation of the dielectric layer 302, the CBM electrode layer 304, the insulator layer 314, and the dielectric pad layer 306. In particular, and as shown in FIG. 5A, the insulator layer 314 is formed prior to the dielectric pad layer 306.

Figure 5E:
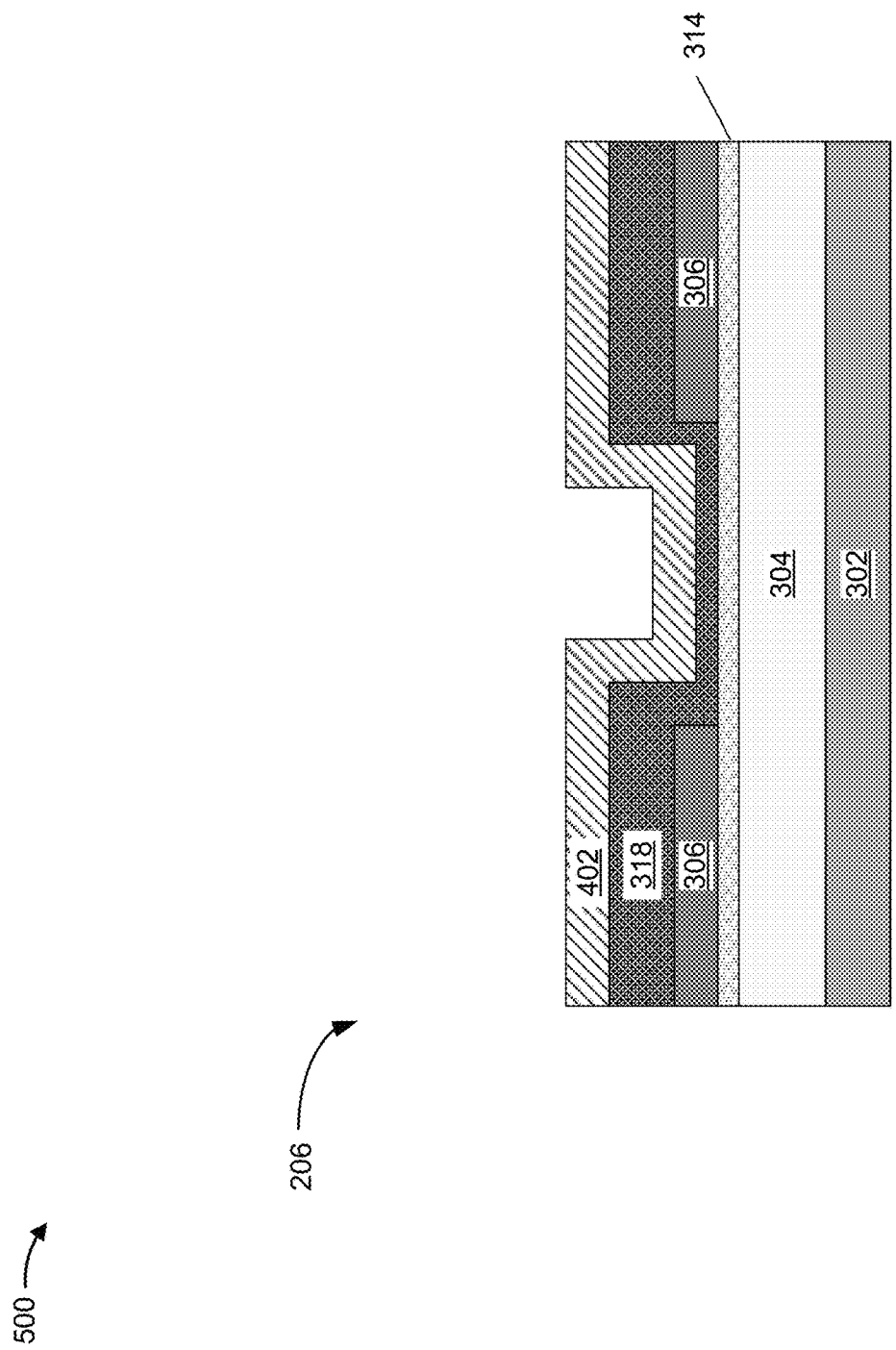
Figure 5F:
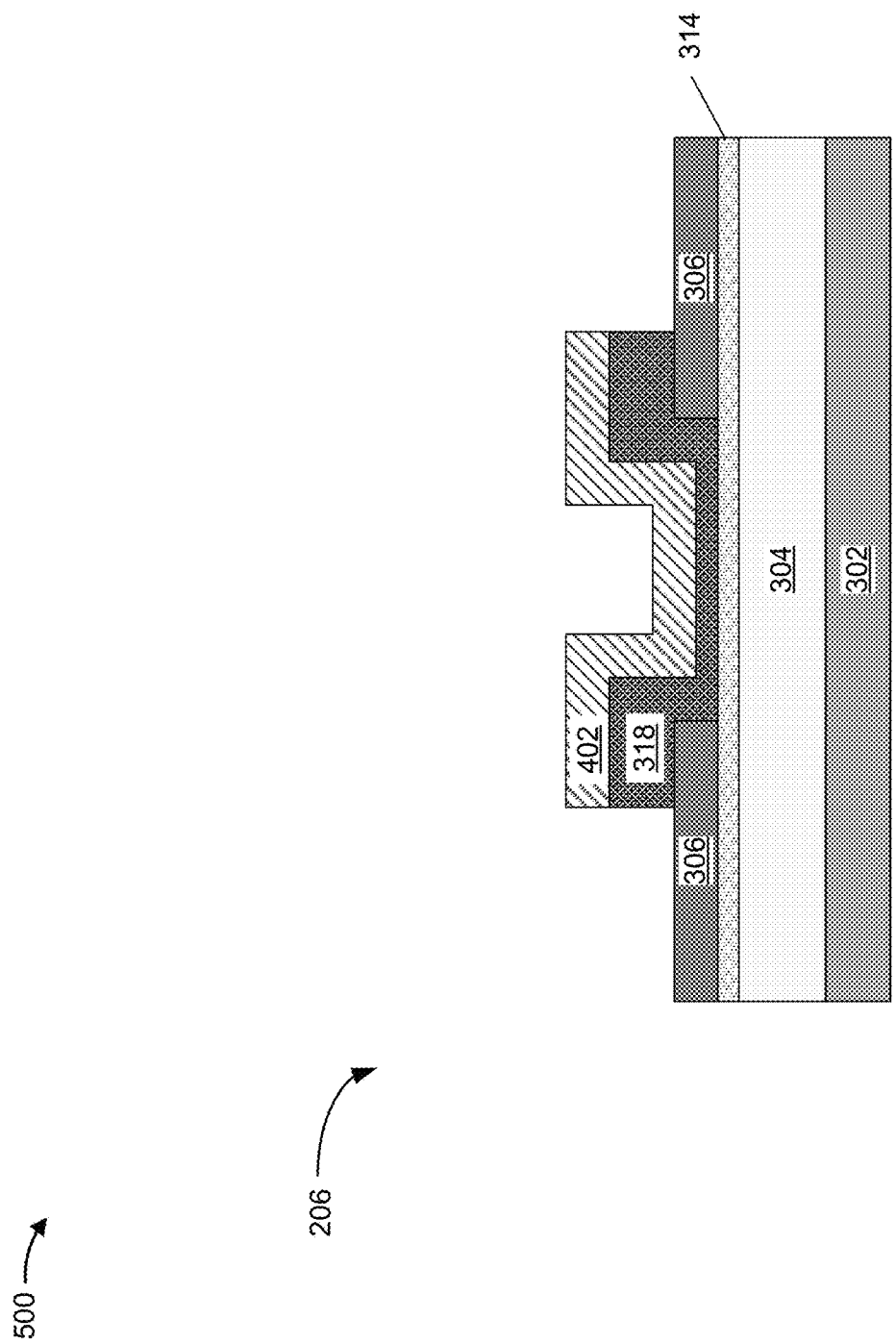
Figure 5G:
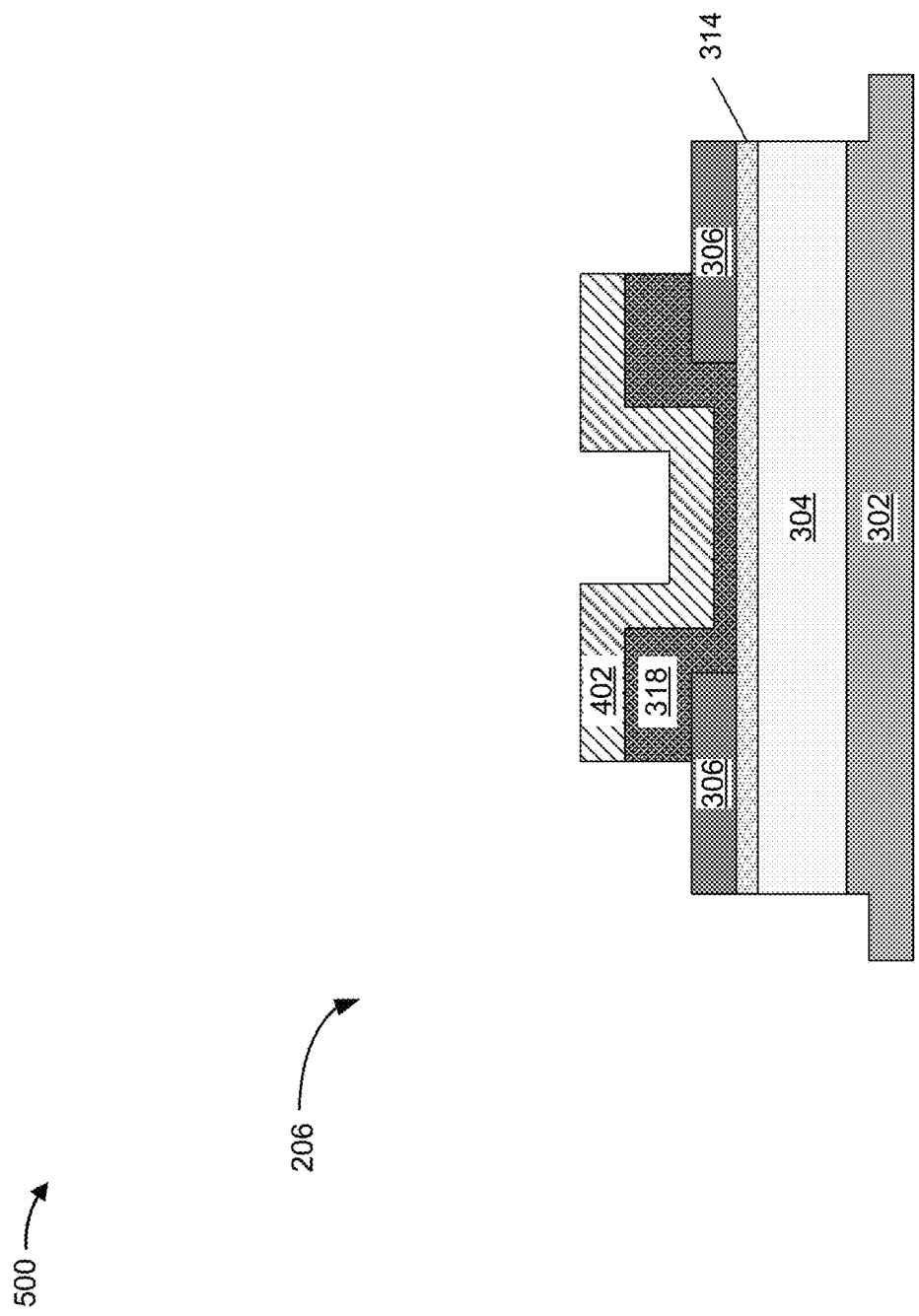

FIGS. 5E-5G show formation of the CTM electrode layer 318 and the dielectric layer 402 over the CTM electrode layer 318. In some implementations, and as shown in FIG. 5E, this structure of including the insulator layer 314 between the dielectric pad layer 306 and the CBM electrode layer 304 may preserve a thickness of the insulator layer 314 during subsequent manufacturing steps to reduce a likelihood of leakage between the CTM electrode layer 318 and the CBM electrode layer 304 within the MIM capacitor 206. Additionally, a thickness of the insulator layer 314 may be tightly controlled to achieve a desired capacitance performance of the MIM capacitor 206.

As shown in FIG. 5F, the dielectric pad layer 306 may perform as an etch stop during the removal of the portions of the dielectric layer 402 and the CTM electrode layer 318. In this way, utilization of the etch tool 108 may be increased (e.g., eliminating multiple etch cycles and/or etch recipes) to reduce a cost of the semiconductor device 202 including the MIM capacitor 206.

Figure 5H:
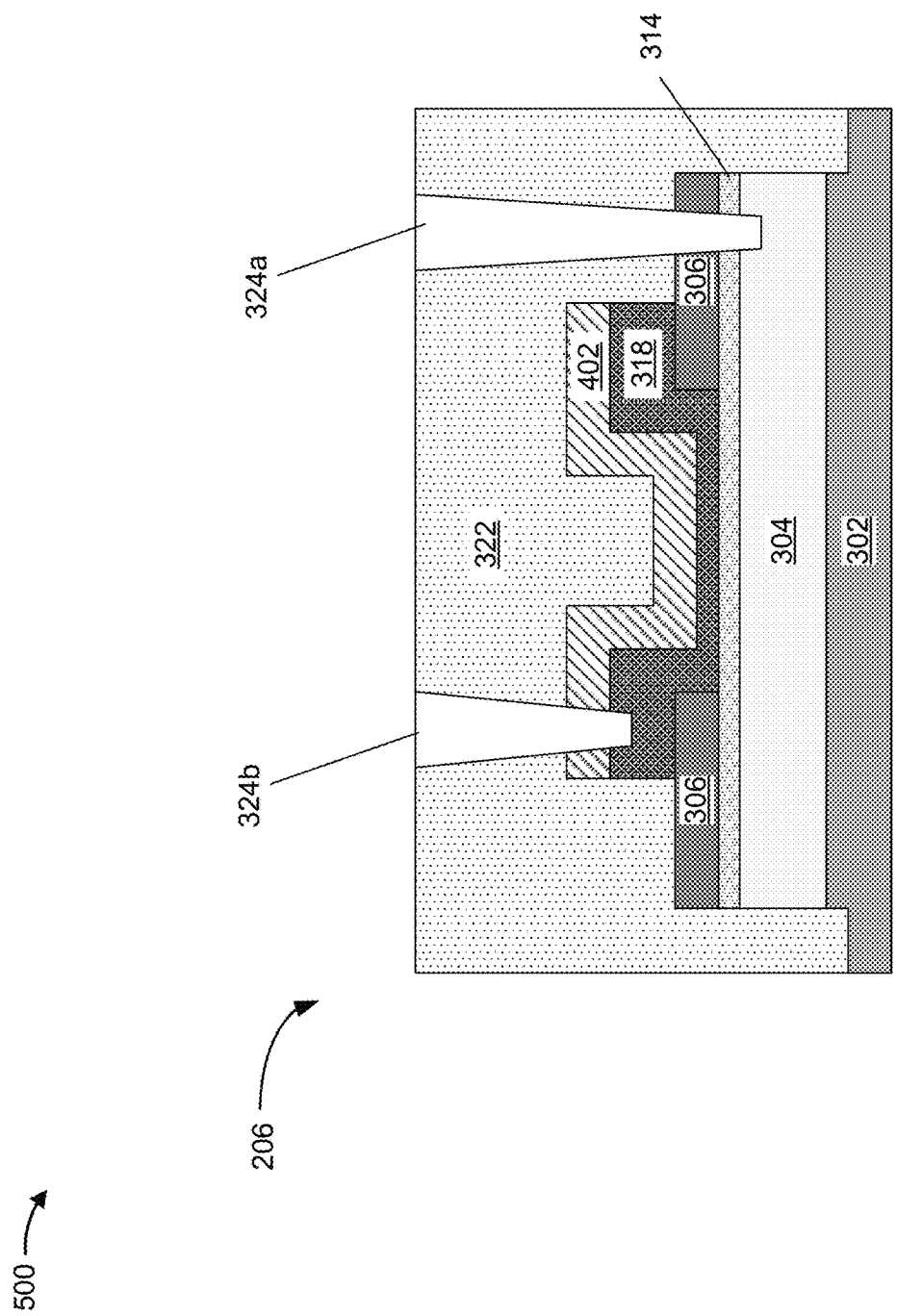

FIG. 5H shows cross-sectional views that include formation of the ILD layer 322 and the interconnect access structures 324 (shown as interconnect access structure 324a and interconnect access structure 324b). The ILD layer 322 may provide electrical isolation between one or more layers of the MIM capacitor 206. The interconnect access structures 324 may provide an electrically conductive path to electrically couple the MIM capacitor 206 to integrated circuitry of the semiconductor device 202 (e.g., the integrated circuitry 204).

In contrast to the MIM capacitor 206 formed using techniques described in connection with FIGS. 3A-3J and/or FIGS. 4A-4G, and as shown in FIG. 5H, a portion of the dielectric pad layer 306 between the CTM electrode layer 318 and the CBM electrode layer 304 is above a portion of the insulator layer 314.

As indicated above, FIGS. 5A-5H are provided as examples. Other examples may differ from what is described with regard to FIGS. 5A-5H.

Figure 6:
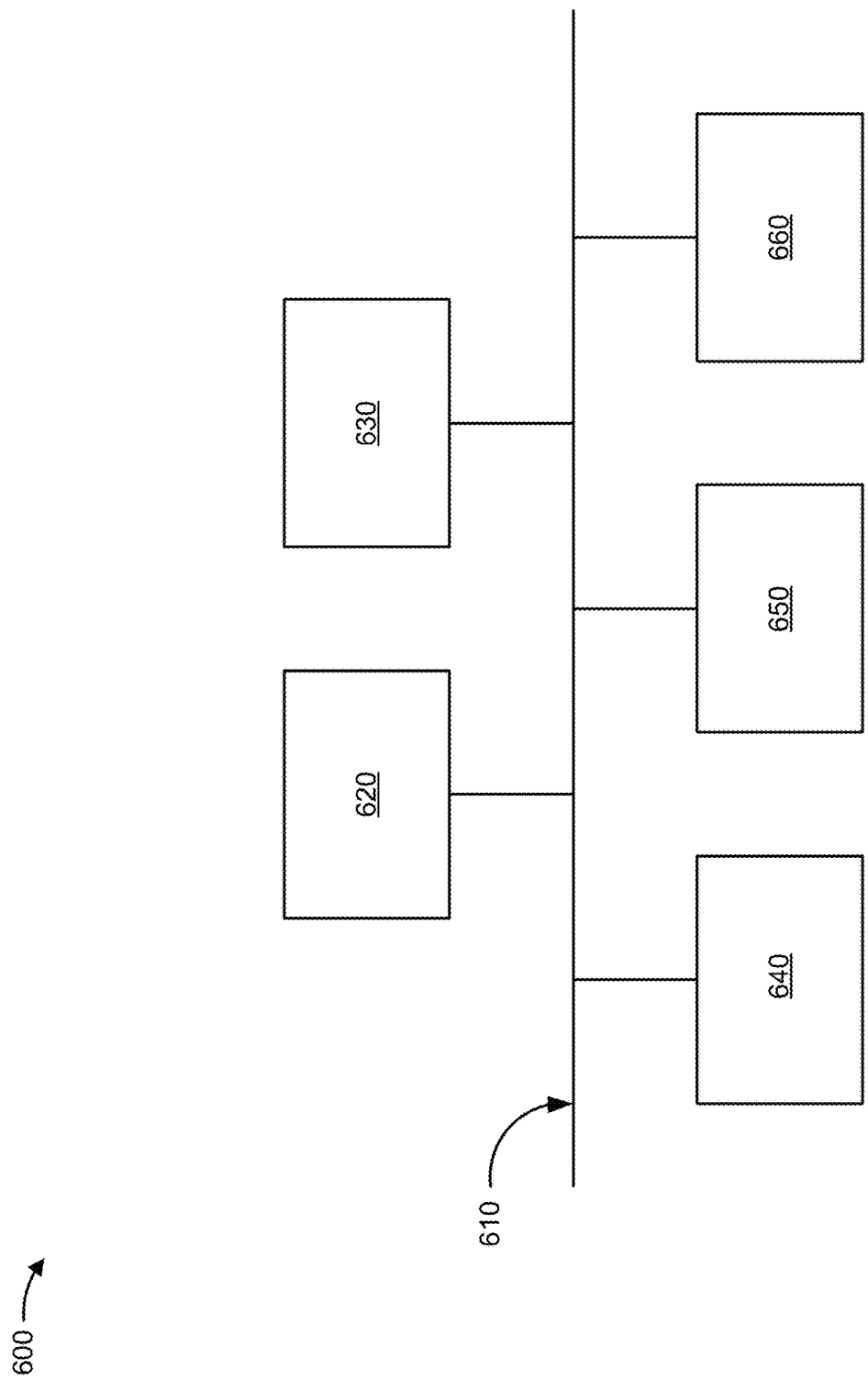

FIG. 6 is a diagram of example components of one or more devices of FIG. 1 described herein. In some implementations, one or more of the semiconductor processing tools 102-112 include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
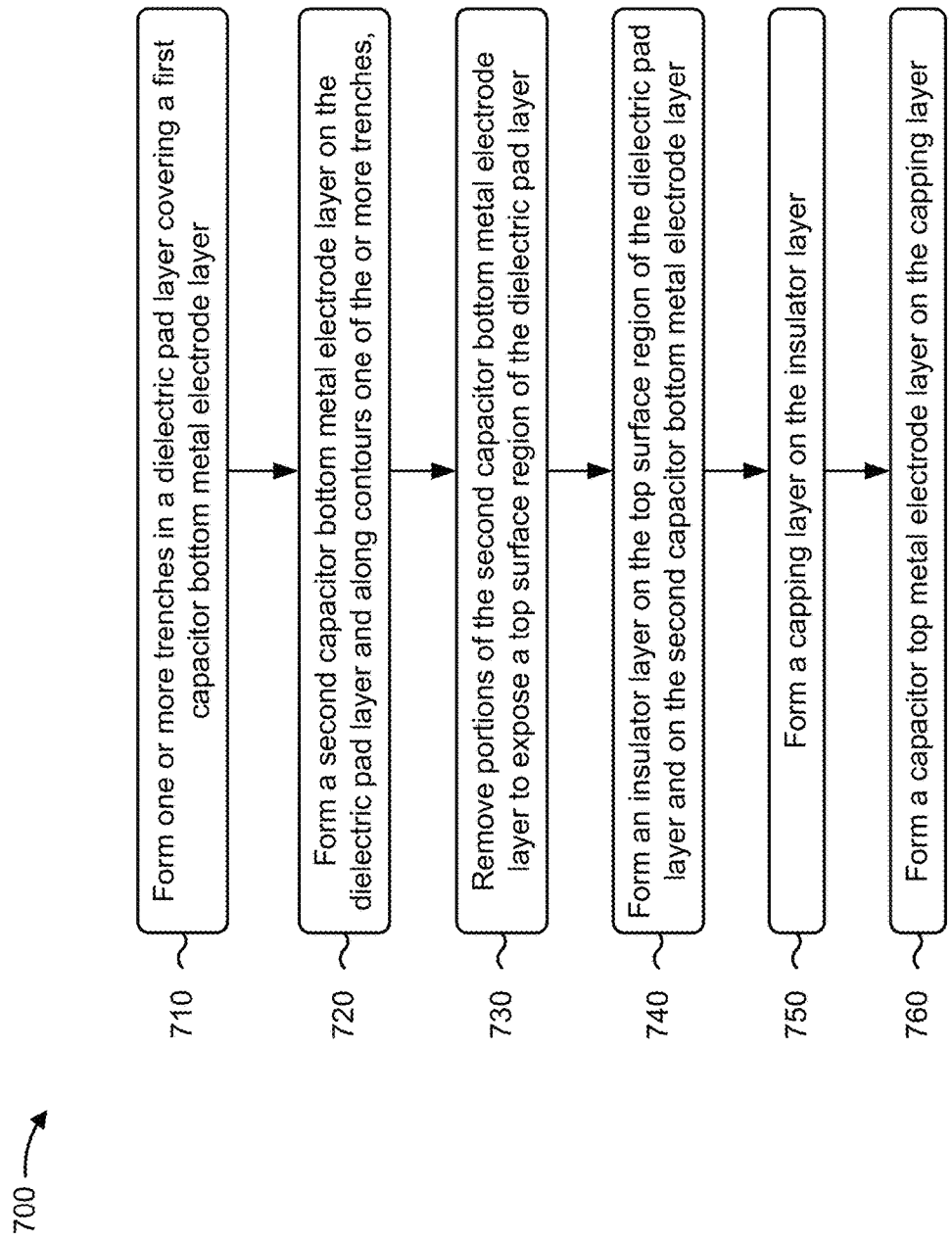

FIG. 7 is a flowchart of an example process associated with fabricating a metal-insulator-metal capacitor described herein. In some implementations, one or more process blocks of FIG. 7 are performed by one or more semiconductor processing tools (e.g., one or more of the semiconductor processing tools 102-112). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming one or more trench regions in a dielectric pad layer covering a first CBM electrode layer (block 710). For example, one or more of the semiconductor processing tools 102-112, such as the etch tool 108, may form one or more trench regions 308 in a dielectric pad layer 306 covering a first CBM electrode layer 304a, as described above. In some implementations, the one or more trench regions 308 expose portions of the first CBM electrode layer 304a.

As further shown in FIG. 7, process 700 may include forming a second CBM electrode layer on the dielectric pad layer and along contours of the one or more trench regions (block 720). For example, one or more of the semiconductor processing tools 102-112, such as the deposition tool 102, may form a second CBM electrode layer 304b on the dielectric pad layer and along contours of the or more trench regions 308, as described above. In some implementations, portions of the second CBM electrode layer 304b contact the portions of the first CBM electrode layer 304a.

As further shown in FIG. 7, process 700 may include removing portions of the second CBM electrode layer to expose a top surface region of the dielectric pad layer (block 730). For example, one or more of the semiconductor processing tools 102-112, such as the etch tool 108, may remove portions of the second CBM electrode layer 304b to expose a top surface region 312 of the dielectric pad layer 306, as described above.

As further shown in FIG. 7, process 700 may include forming an insulator layer on the top surface region of the dielectric pad layer and on the second CBM electrode layer (block 740). For example, one or more of the semiconductor processing tools 102-112, such as the deposition tool 102, may form an insulator layer 314 on the top surface region 312 of the dielectric pad layer 306 and on the second CBM electrode layer 304b, as described above.

As further shown in FIG. 7, process 700 may include forming a capping layer on the insulator layer (block 750). For example, one or more of the semiconductor processing tools 102-112, such as the deposition tool 102, may form a capping layer 316 on the insulator layer, as described above.

As further shown in FIG. 7, process 700 may include forming a CTM electrode layer on the capping layer (block 760). For example, one or more of the semiconductor processing tools 102-112, such as the deposition tool 102, may form a CTM electrode layer 318 on the capping layer 316, as described above.

Process 700 may include additional implementations, such as any single implementation or any combination of implementations described below and/or in connection with one or more other processes described elsewhere herein.

In a first implementation, process 700 includes forming the dielectric pad layer 306 by depositing a layer of a silicon nitride material, a layer of a silicon dioxide material, a layer of a silicon oxynitride material, or a layer of a silicon oxy carbonitride material.

In a second implementation, alone or in combination with the first implementation, process 700 includes forming the dielectric pad layer 306 by depositing a layer of a hafnium oxide material, a layer of a zirconium dioxide material, a layer of a titanium oxide material, or a layer of an aluminum oxide material.

In a third implementation, alone or in combination with one or more of the first and second implementations, process 700 includes removing portions of the CTM electrode layer 318, the capping layer 316, the insulator layer 314, and the dielectric pad layer 306 to expose a recessed surface region 320 of the dielectric pad layer 306, and forming an inter-layer dielectric layer 322 on the CTM electrode layer 318 and the recessed surface region 320 of the dielectric pad layer 306.

In a fourth implementation, alone or in combination with one or more of the first through third implementations, process 700 includes forming, through the inter-layer dielectric layer and 320 through the dielectric pad layer 306 at the recessed surface region 320, an interconnect access structure 324a to electrically connect to the first CBM electrode layer 304a.

In a fifth implementation, alone or in combination with one or more of the first through fourth implementations, process 700 includes forming, through the inter-layer dielectric layer 322 and through the CTM electrode layer 318, an interconnect access structure 324b to physically contact the capping layer 316 and to electrically connect to the CTM electrode layer 318.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations described herein provide techniques and apparatuses for forming a semiconductor device including a MIM capacitor. The MIM capacitor includes a dielectric pad layer having a portion between a CBM electrode layer and a portion of an insulator layer. The dielectric pad layer may preserve a thickness of the insulator layer to reduce a likelihood of a leakage or breakdown between a CTM electrode layer and the CBM electrode layer. The dielectric pad layer may also enable a reduction in a thickness of the insulator layer to increase a capacitance of the MIM capacitor.

In this way, a performance of the MIM capacitor may be increased. Furthermore, in some implementations, the dielectric pad layer performs as an etch stop during formation of a layer stack including the dielectric pad layer, the CBM electrode layer, and the insulator layer to reduce use of an etch tool. In this way, a cost of the semiconductor device including the MIM capacitor may be decreased.

As described in greater detail above, some implementations described herein provide a device. The device includes a CTM electrode layer. The device includes a CBM electrode layer. The device includes an insulator layer between CTM electrode layer and the CBM electrode layer. The device includes a dielectric pad layer including a portion between the CTM electrode layer and the CBM electrode layer. The device includes an interconnect access structure passing through another portion of the dielectric pad layer to electrically connect to the CBM electrode layer.

As described in greater detail above, some implementations described herein provide a method. The method includes forming one or more trench regions in a dielectric pad layer covering a first CBM electrode layer, where the one or more trench regions expose portions of the first CBM electrode layer. The method includes forming a second CBM electrode layer on the dielectric pad layer and along contours of the or more trench regions, where portions of the second CBM electrode layer contact the portions of the first CBM electrode layer. The method includes removing portions of the second CBM electrode layer to expose a top surface region of the dielectric pad layer. The method includes forming an insulator layer on the top surface region of the dielectric pad layer and on the second CBM electrode layer. The method includes forming a capping layer on the insulator layer. The method includes forming a CTM electrode layer on the capping layer.

As described in greater detail above, some implementations described herein provide a semiconductor device. The semiconductor device includes integrated circuitry. The semiconductor device includes a metal-insulator-metal capacitor having an insulator layer between a CTM electrode layer and a CBM electrode layer. The metal-insulator-metal capacitor includes a dielectric pad layer including a first portion between the CTM electrode layer and the CBM electrode layer. The metal-insulator-metal capacitor includes a first interconnect access structure passing through a second portion of the dielectric pad layer to electrically connect to the CBM electrode layer. The metal-insulator-metal capacitor includes a second interconnect access structure passing through the CTM electrode layer to make physical contact with a capping layer, where the second interconnect access structure passing through the CTM electrode layer causes the second interconnect access structure to electrically connect to the CTM electrode layer above another portion of the dielectric pad layer, and where the first interconnect access structure and the second interconnect access structure electrically couple the metal-insulator-metal capacitor to the integrated circuitry.

The foregoing outlines features of several embodiments so that those skilled in the art may better understand the aspects of the present disclosure. Those skilled in the art should appreciate that they may readily use the present disclosure as a basis for designing or modifying other processes and layers for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a capacitor top metal electrode layer;
   a first capacitor bottom metal electrode layer;
   a second capacitor bottom metal electrode layer;
   an insulator layer between the capacitor top metal electrode layer and the first capacitor bottom metal electrode layer, wherein the insulator layer surrounds opposing sides of the second capacitor bottom metal electrode layer;
   a dielectric pad layer comprising a first portion between the capacitor top metal electrode layer and the first capacitor bottom metal electrode layer, wherein the first portion of the dielectric pad layer is in contact with a first portion of the insulator layer; and
   an interconnect access structure passing through a second portion of the dielectric pad layer to electrically connect to the first capacitor bottom metal electrode layer.

2. The device of claim 1, wherein the dielectric pad layer comprises:
   one or more trench regions.

3. The device of claim 2, wherein the insulator layer comprises:
   a shape that conforms to the one or more trench regions.

4. The device of claim 1, wherein the dielectric pad layer comprises:
   a thickness that is included in a range of approximately 20 nanometers to approximately 2000 nanometers.

5. The device of claim 1, the insulator layer comprises:
   a thickness that is included in a range of approximately 1 nanometer to approximately 100 nanometers.

6. The device of claim 1, wherein edges of the insulator layer are aligned to edges of the capacitor top metal electrode layer.

7. The device of claim 1, wherein the first portion of the dielectric pad layer is below the first portion of the insulator layer.

8. The device of claim 1, wherein the first portion of the dielectric pad layer is above a second portion of the insulator layer.

9. The device of claim 1, further comprising:
   a capping layer between the capacitor top metal electrode layer and the insulator layer.

10. The device of claim 9, wherein the interconnect access structure corresponds to a first interconnect access structure, and the device further comprising:
    a second interconnect access structure passing through the capacitor top metal electrode layer to make physical contact with the capping layer and electrically connect to the capacitor top metal electrode layer above a third portion of the dielectric pad layer.

11. A method, comprising:
    forming one or more trench regions in a dielectric pad layer covering a first capacitor bottom metal electrode layer,
      wherein the one or more trench regions expose portions of the first capacitor bottom metal electrode layer;
    forming a second capacitor bottom metal electrode layer on the dielectric pad layer and along contours of the one or more trench regions,
      wherein portions of the second capacitor bottom metal electrode layer contact the portions of the first capacitor bottom metal electrode layer;
    removing portions of the second capacitor bottom metal electrode layer to expose a top surface region of the dielectric pad layer;
    forming an insulator layer on the top surface region of the dielectric pad layer and on the second capacitor bottom metal electrode layer;
    forming a capping layer on the insulator layer; and
    forming a capacitor top metal electrode layer on the capping layer.

12. The method of claim 11, further comprising:
    forming the dielectric pad layer by depositing a layer of a silicon nitride material, a layer of a silicon dioxide material, a layer of a silicon oxynitride material, or a layer of a silicon oxy carbonitride material.

13. The method of claim 11, further comprising:
    forming the dielectric pad layer by depositing a layer of a hafnium oxide material, a layer of a zirconium dioxide material, a layer of a titanium oxide material, or a layer of an aluminum oxide material.

14. The method of claim 11, further comprising:
removing portions of the capacitor top metal electrode layer, the capping layer, the insulator layer, and the dielectric pad layer to expose a recessed surface region of the dielectric pad layer; and
forming an inter-layer dielectric layer on the capacitor top metal electrode layer and the recessed surface region of the dielectric pad layer.

15. The method of claim 14, further comprising:
forming, through the inter-layer dielectric layer and through the dielectric pad layer at the recessed surface region, an interconnect access structure to electrically connect to the first capacitor bottom metal electrode layer.

16. The method of claim 14, further comprising:
forming, through the inter-layer dielectric layer and through the capacitor top metal electrode layer, an interconnect access structure to physically contact the capping layer and to electrically connect to the capacitor top metal electrode layer.

17. A semiconductor device, comprising:
integrated circuitry; and
a metal-insulator-metal capacitor comprising:
an insulator layer between a capacitor top metal electrode layer and a first capacitor bottom metal electrode layer, wherein the insulator layer surrounds opposing sides of s second capacitor bottom metal electrode layer;
a dielectric pad layer comprising a first portion between the capacitor top metal electrode layer and the first capacitor bottom metal electrode layer, wherein the first portion of the dielectric pad layer is in contact with a portion of the insulator layer;
a first interconnect access structure passing through a second portion of the dielectric pad layer to electrically connect to the first capacitor bottom metal electrode layer; and
a second interconnect access structure passing through the capacitor top metal electrode layer to make physical contact with a capping layer,
wherein the second interconnect access structure electrically connects to the capacitor top metal electrode layer above a third portion of the dielectric pad layer, and
wherein the first interconnect access structure and the second interconnect access structure electrically couple the metal-insulator-metal capacitor to the integrated circuitry.

18. The semiconductor device of claim 17, wherein the integrated circuitry corresponds to memory circuitry and the metal-insulator-metal capacitor corresponds to a memory cell.

19. The semiconductor device of claim 17, wherein the integrated circuitry corresponds to imager circuitry and the metal-insulator-metal capacitor corresponds to a pixel overflow capacitor.

20. The semiconductor device of claim 17, wherein the integrated circuitry corresponds to transistor circuitry and the metal-insulator-metal capacitor corresponds to a coupling capacitor.

* * * * *